(12) United States Patent
Oh et al.

(10) Patent No.: US 9,881,671 B2
(45) Date of Patent: Jan. 30, 2018

(54) RESISTIVE MEMORY DEVICE, RESISTIVE MEMORY SYSTEM, AND METHOD OF OPERATING THE RESISTIVE MEMORY SYSTEM

(71) Applicant: SAMSUNG ELECTRONICS CO., LTD., Suwon-si, Gyeonggi-Do (KR)

(72) Inventors: Eun Chu Oh, Hwaseong-si (KR); Young-Geon Yoo, Seoul (KR); Jun Jin Kong, Yongin-si (KR); Hong-Rak Son, Anyang-si (KR); Han-Shin Shin, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/044,301

(22) Filed: Feb. 16, 2016

(65) Prior Publication Data

US 2016/0240250 A1    Aug. 18, 2016

(30) Foreign Application Priority Data

Feb. 17, 2015    (KR) ........................ 10-2015-0024311

(51) Int. Cl.
*G11C 13/00* (2006.01)
*G11C 11/16* (2006.01)
*G11C 11/56* (2006.01)
*G06F 11/10* (2006.01)

(52) U.S. Cl.
CPC ........ *G11C 13/004* (2013.01); *G06F 11/1048* (2013.01); *G11C 11/1655* (2013.01); *G11C 11/1673* (2013.01); *G11C 11/5607* (2013.01); *G11C 11/5657* (2013.01); *G11C 11/5664* (2013.01); *G11C 11/5678* (2013.01); *G11C 11/5685* (2013.01); *G11C 13/0026* (2013.01); *G11C 13/0069* (2013.01); *G11C 2013/0054* (2013.01); *G11C 2213/72* (2013.01)

(58) Field of Classification Search
CPC ................ G11C 2013/0045; G11C 2013/0054
USPC ......................................................... 365/148
See application file for complete search history.

(56) References Cited

U.S. PATENT DOCUMENTS

| | | |
|---|---|---|
| 6,831,872 B2 | 12/2004 | Matsuoka |
| 7,400,521 B1 | 7/2008 | Hoenigschmid |
| 7,542,337 B2 | 6/2009 | Scheuerlein et al. |
| 7,755,923 B2 | 7/2010 | Liu et al. |
| 7,796,424 B2 | 9/2010 | Happ et al. |
| 7,876,621 B2 | 1/2011 | Sharon et al. |
| 8,040,723 B2 | 10/2011 | Sheu et al. |
| 8,503,237 B1 | 8/2013 | Horn |
| 2008/0002483 A1* | 1/2008 | Rinerson ............ G11C 13/0007 365/189.09 |

(Continued)

*Primary Examiner* — Huan Hoang
*Assistant Examiner* — Jay Radke
(74) *Attorney, Agent, or Firm* — Volentine & Whitt, PLLC

(57) ABSTRACT

A method is for operating a resistive memory system including a resistive memory device implemented as multi-level memory cells. The method includes setting levels of reference voltages used to determine resistance states of the multi-level memory cells, and reading data of the multi-level memory cells based on the reference voltages. A difference between the reference voltages used to determine a relatively high resistance state is greater than a difference between the reference voltages used to determine a relatively low resistance state.

14 Claims, 21 Drawing Sheets

(56) References Cited

U.S. PATENT DOCUMENTS

| | | | |
|---|---|---|---|
| 2008/0117663 A1* | 5/2008 | Philipp | G11C 7/04 |
| | | | 365/148 |
| 2009/0323395 A1* | 12/2009 | Ueda | G11C 11/56 |
| | | | 365/148 |
| 2010/0296350 A1* | 11/2010 | Kim | G11C 11/5642 |
| | | | 365/189.15 |
| 2013/0159798 A1 | 6/2013 | Yang | |
| 2014/0003137 A1 | 1/2014 | Noshiro | |
| 2014/0063904 A1 | 3/2014 | Yon | |
| 2014/0185361 A1 | 7/2014 | Oh et al. | |
| 2014/0192588 A1* | 7/2014 | Lee | G11C 13/004 |
| | | | 365/148 |

* cited by examiner

RESISTIVE MEMORY DEVICE, RESISTIVE MEMORY SYSTEM, AND METHOD OF OPERATING THE RESISTIVE MEMORY SYSTEM

CROSS-REFERENCE TO RELATED APPLICATION

This application claims the benefit of Korean Patent Application No. 10-2015-0024311, filed on Feb. 17, 2015, in the Korean Intellectual Property Office, the disclosure of which is incorporated herein in its entirety by reference.

BACKGROUND

The inventive concept relates to a resistive memory device, and more particularly, to a resistive memory device including a multi-level cell, a resistive memory system, and a method of operating the resistive memory system.

According to a demand for memory devices with a high capacity and low power consumption, research into next-generation memory devices, which are non-volatile and do not require refreshing, is being conducted. The next-generation memory devices may need to have high integrity characteristics of dynamic random access memory (DRAM), non-volatile characteristics of a flash memory, and high speed characteristics of static RAM (SRAM). As the next-generation memory devices, phase change RAM (PRAM), a nano floating gate memory (NFGM), polymer RAM (PoRAM), magnetic RAM (MRAM), ferroelectric RAM (FeRAM), and resistive RAM (RRAM) are being highlighted.

SUMMARY

The inventive concept provides a resistive memory system capable of reducing errors when data is read, and a method of operating the resistive memory system.

According to an aspect of the inventive concept, there is provided a method of operating a resistive memory system including a resistive memory device implemented as multi-level memory cells, the method including: setting levels of reference voltages used to determine resistance states of the multi-level memory cells; and reading data of the multi-level memory cells based on the reference voltages. A difference between the reference voltages used to determine a relatively high resistance state is greater than a difference between the reference voltages used to determine a relatively low resistance state.

According to another aspect of the inventive concept, there is provided a method of operating a resistive memory system including multi-level memory cells, the method including: programming first to third reference cells to have different resistance levels such that a difference between resistance levels of the first reference cell and the second reference cell is greater than a difference between resistance levels of the second reference cell and the third reference cell; generating first to third reference voltages having different levels based on the resistance levels of a plurality of reference cells including the first to third reference cells; and reading data of the multi-level memory cells based on the first to third reference voltages.

According to another aspect of the inventive concept, there is provided a method a resistive memory system comprising a memory controller, including a reference voltage setting unit, and configured to control a resistive memory device including multi-level memory cells and an associated read circuit. The method includes setting levels of reference voltages, with the reference voltage setting unit, in the read circuit of the memory device that are used to determine resistance states of the multi-level memory cells, and reading data of the multi-level memory cells, with the read circuit, based on the reference voltages. A difference between the reference voltages used to determine a relatively high resistance state is greater than a difference between the reference voltages used to determine a relatively low resistance state.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
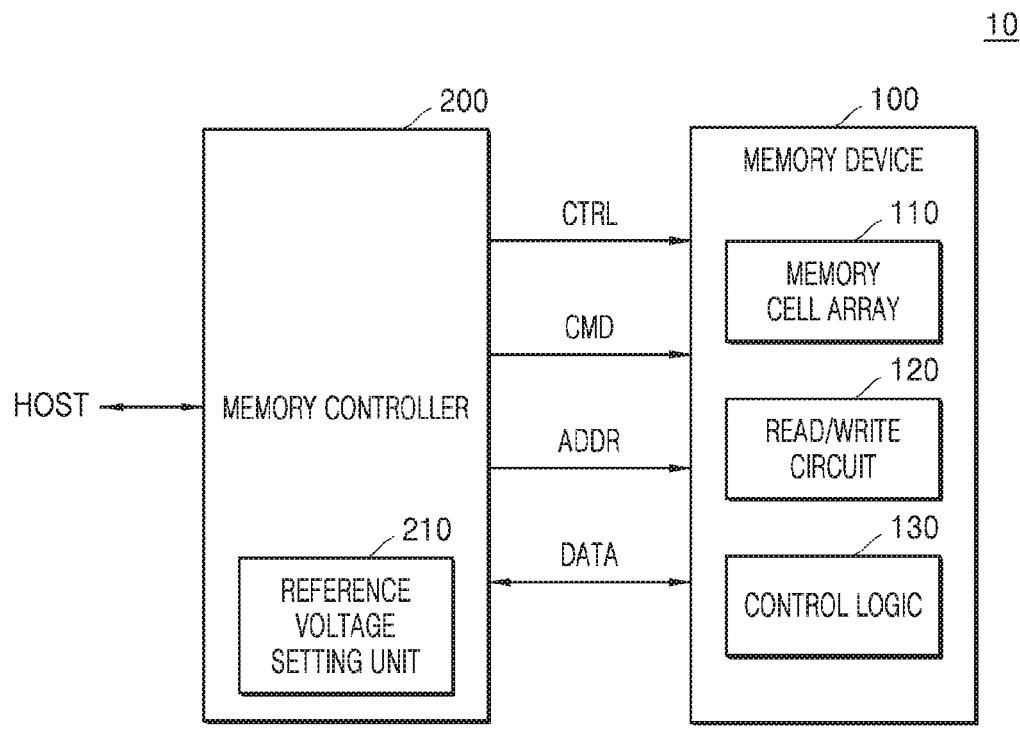
FIG. 1 is a block diagram illustrating a memory system according to an exemplary embodiment.

Hereinafter, the inventive concept will be described more fully with reference to the accompanying drawings, in which exemplary embodiments of the inventive concept are shown. This inventive concept may, however, be embodied in many different forms and should not be construed as limited to the exemplary embodiments set forth herein. Rather, these exemplary embodiments are provided so that this inventive concept will be thorough and complete, and will fully convey the scope of the inventive concept to one of ordinary skill in the art. As the inventive concept allows for various changes and numerous embodiments, particular exemplary embodiments will be illustrated in the drawings and described in detail in the written description. However, this is not intended to limit the inventive concept to particular modes of practice, and it is to be appreciated that all changes, equivalents, and substitutes that do not depart from the spirit and technical scope of the inventive concept are encompassed in the inventive concept. In the description of the inventive concept, certain detailed explanations of the related art are omitted when it is deemed that they may unnecessarily obscure the essence of the inventive concept. Like reference numerals in the drawings denote like elements. In the drawings, the thicknesses of layers and regions are exaggerated for clarity.

The terms used in the present specification are merely used to describe particular exemplary embodiments, and are not intended to limit the inventive concept. An expression used in the singular encompasses the expression of the plural, unless it has a clearly different meaning in the context. In the present specification, it is to be understood that the terms such as "including", "having", and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

It will be understood that although the terms "first", "second", etc. may be used herein to describe various components, these components should not be limited by these terms. These components are only used to distinguish one component from another. For example, a first component may be referred to as a second component, and similarly, a second component may be referred to as a first component without departing from the scope of the inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram of a memory system 10 according to an exemplary embodiment.

Referring to FIG. 1, the memory system 10 may include a resistive memory device 100 (hereinafter, referred to as a 'memory device') and a memory controller 200. The memory device 100 may include a memory cell array 110, a read/write circuit 120, and a control logic 130. Also, the memory device 100 may further include circuits configured to perform read and write operations on the memory cell array 110 in accordance with the control of the control logic 130. As the memory cell array 110 includes resistive memory cells, the memory system 10 may be referred to as a resistive memory system.

In response to a read/write request from a host, the memory controller 200 may control the memory device 100 such that data stored in the memory device 100 may be read or data is written to the memory device 100. In detail, the memory controller 200 may provide the memory device 100 with an address ADDR, a command CMD, and a control signal CTRL and thus may control a programming (or write) operation, a read operation, and an erase operation on the memory device 100. Also, the memory controller 200 may transmit data DATA, which is to be written, to the memory device 100 and may receive the read data DATA from the memory device 100.

Although not illustrated, the memory controller 200 may include random access memory (RAM), a processing unit, a host interface, and a memory interface. The RAM may be used as an operation memory of the processing unit. The processing unit may control operations of the memory controller 200. The host interface may include a protocol used to exchange data between the host and the memory controller 200. For example, the memory controller 200 may communicate with an external host via at least one of various interface protocols such as a universal serial bus (USB), a multimedia card (MMC), a peripheral component interconnection-express (PCI-E), an advanced technology attachment (ATA), a serial-ATA, a parallel-ATA, a small computer system interface (SCSI), an enhanced small device interface (ESDI), and an integrated drive electronics (IDE).

The memory cell array 110 may include a plurality of memory cells (not shown) that are disposed respectively in regions where a plurality of first signal lines and a plurality of second signal lines cross each other. According to an exemplary embodiment, the first signal lines may be word lines, and the second signal lines may be bit lines. According to another exemplary embodiment, the first signal lines may be bit lines, and the second signal lines may be word lines.

In the present exemplary embodiment, each of the memory cells may be a multi-level cell (MLC) capable of storing at least two-bit data. Alternatively, the memory cell array 110 may include a single-level cell (SLC) that stores 1-bit data and an MLC. When 1-bit data is written to one memory cell, the memory cells may have two resistance distributions in accordance with the written data. Alternatively, when 2-bit data is written to one memory cell, the memory cells may have four resistance distributions in accordance with the written data. According to another exemplary embodiment, in a triple-level cell (TLC) that stores 3-bit data, the memory cells may have eight resistance distributions in accordance with the written data. However, the inventive concept is not limited thereto, and according to another exemplary embodiment, the memory cells may include memory cells that may respectively store 4-bit or more data.

Also, according to an exemplary embodiment, the memory cell array 110 may include memory cells that are arranged in a horizontal two-dimensional structure. According to another exemplary embodiment, the memory cell array 110 may include memory cells that are arranged in a vertical three-dimensional structure.

According to an exemplary embodiment, the memory cell array 110 may include a plurality of cell areas. The cell areas may be variously defined and may be, for example, in a page unit including memory cells connected to the same word line. As another example, the cell areas include memory cells, and the memory cells are connected to word lines and bit lines. The word lines are connected to a row decoder, and the bit lines are connected to a column decoder. The cell areas may be defined as tiles.

The memory cell array 110 may include resistive memory cells including a variable resistor device (not shown) having a variable resistance. For example, when resistance of the variable resistor device that is formed of a phase change material (e.g., GST, Ge—Sb—Te) changes according to temperature, a memory device 100 may be a phase change RAM (PRAM). As another example, when the variable resistor device is formed of an upper electrode, a lower electrode, and a transition metal oxide (complex metal oxide) therebetween, the memory device 100 may be a resistive RAM (ReRAM). As another example, when the variable resistor device is formed of an upper electrode of a magnetic material, a lower electrode of a magnetic material, and a dielectric therebetween, the memory device 100 may be a magnetic RAM (MRAM). Hereinafter, it is assumed that memory device 100 is a ReRAM.

The read/write circuit 120 performs a read operation and a write operation on the memory cells. The read/write circuit 120 is connected to the memory cells via the bit lines and may include a write driver configured to write data to the memory cells and a sense amplifier configured to amplify data read from the memory cells. The read/write circuit 120 may perform the read operation and a write operation on the memory cells by providing current pulses or voltage pulses to memory cells selected from among the memory cells by a row decoder (not shown) and a column decoder (not shown).

The control logic 130 may control overall operations of the memory device 100. The control logic 130 may control the read/write circuit 120 to perform memory operations such as a write operation or a read operation. For example, the memory device 100 may include a power generator (not shown) configured to generate voltages and currents used to perform the write and read operations, and levels of the voltages and those of currents may be adjusted under the control of the control logic 130.

In the write operation performed on the memory device 100, a level of a variable resistance of the memory cells of the memory cell array 110 may increase in accordance with written data. Alternatively, a level of a variable resistance of the memory cells may decrease. For example, each of the memory cells of the memory cell array 110 may have a resistance level in accordance with stored data, and the resistance level may increase or decrease in accordance with data to be written to each memory cell. The write operation described above may be classified into a reset write operation and a set write operation. Resistive memory cells may have a relatively low resistance level in a set state and may have a relatively high resistance level in a reset state.

When the set write operation is performed on the ReRAM, a vacancy is formed due to movement of oxygen ions, filaments are formed of an oxygen vacancy, and thus the resistance levels of the memory cells may decrease. When the reset write operation is performed, filaments are cut due to a recombination of oxygen ions with a vacancy, and the resistance levels of the memory cells may increase.

In this case, the resistance levels of the memory cells are determined according to the amount of filaments formed in the memory cells. In a high resistance state, the number of filaments is small, and thus a distribution of the resistance levels may be relatively greater than in a low resistance state. Accordingly, when data is read, errors may easily occur. In this case, the high and low resistance states do not indicate states higher and lower than a certain resistance level, but indicate states that are relatively higher and lower than other resistance states. Throughout the specification, it will be understood that the high and low resistance states are relative.

According to an exemplary embodiment, when levels of read reference voltages (hereinafter, referred to as 'reference voltages') used to determine resistance states are set, the memory system 10 may set levels of the reference voltages such that a difference between reference voltages used to determine a high resistance state is greater than a difference between reference voltages used to determine a low resistance state.

According to an exemplary embodiment, the memory system 10 may differently set the differences between the reference voltages respectively used to distinguish the resistance states from each other. Thus, the difference between the reference voltages used to determine the high resistance state may be greater than the difference between the reference voltages used to determine the low resistance state.

According to another exemplary embodiment, when the memory system 10 reads data multiple times by changing the levels of the reference voltages, the memory system 10 may differently set a difference between levels of reference voltages previously used to read the data and levels of reference voltages to be used to read data next time, for example, offset voltages, in accordance with resistance states respectively corresponding to the reference voltages. Thus, an offset voltage of the reference voltages corresponding to the high resistance state may be relatively greater than an offset voltage of the reference voltages corresponding to the low resistance state.

In the present exemplary embodiment, the memory controller 200 may set the reference voltages and thus may include a reference voltage setting unit 210.

The memory system 10 differently sets the difference between the reference voltages by reflecting a difference between dispersions according to the resistance states, and thus, an error occurrence probability may be reduced when the data is read. Also, the number of additional read operations of accurately reading data decreases, and thus read latency may decrease.

The memory controller 200 and the memory device 100 may be integrated into a single semiconductor device. For example, the memory controller 200 and the memory device 100 are integrated into a semiconductor device and may form a memory card. For example, the memory controller 200 and the memory device 100 are integrated into a semiconductor device and may form a personal computer card (PCMCIA), a compact flash card (CF), a smart media card (SM/SMC), a memory stick, a multimedia card (MMC, RS-MMC, or MMCmicro), an SD card (SD, miniSD, or microSD), a universal flash storage (UFS), etc. As another example, the memory controller 200 and the memory device 100 are integrated into a semiconductor device and may form a Solid State Disk/Drive (SSD).

Figure 2:
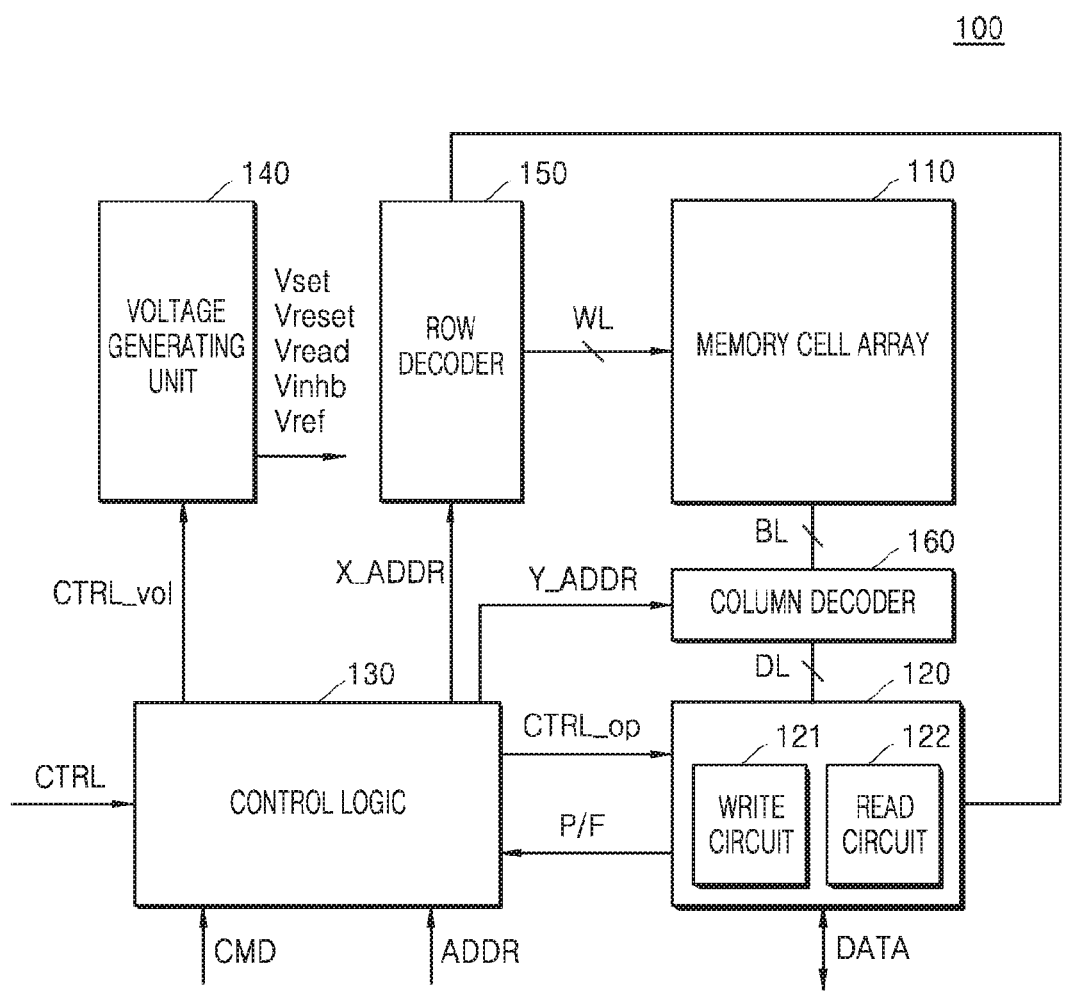
FIG. 2 is a block diagram illustrating an example of a memory device of FIG. 1.

FIG. 2 is a block diagram of an example of the memory device 100 of FIG. 1.

Referring to FIG. 2, the memory device 100 may include the memory cell array 110, the read/write circuit 120, the control logic 130, and a voltage generating unit 140. Also, the memory device 100 may further include a row decoder 150 and a column decoder 160. Also, the read/write circuit 120 may include a write circuit 121 and a read circuit 122.

The memory cell array 110 may be connected to a plurality of first signal lines and a plurality of second signal lines. Also, the memory cell array 110 may include a plurality of memory cells respectively arranged in regions where the first signal lines and the second signal lines cross each other. Hereinafter, a case where the first signal lines are word lines WLs and the second signal lines are bit lines BLs will be described.

An address ADDR designating the memory cells to be accessed in response to a command CMD may be received and may include a row address X_ADDR used to select word lines WLs of the memory cell array 110 and a column address Y_ADDR used to select bit lines BLs of the memory cell array 110. The row decoder 150 is connected to the memory cell array 110 via the word lines WLs and may select at least one of the word lines WLs in response to the row address X_ADDR. The column decoder 160 is connected to the memory cell array 110 via the bit lines BLs and may select at least one of the bit lines BLs in response to the column address Y_ADDR.

The read/write circuit 120 may write data DATA, which is input from outside the memory device 100, to the memory cell array 110 or may detect the data DATA written to the memory cell array 110 and output the detected data DATA to the outside of the memory device 100. Also, the read/write circuit 120 may provide the control logic 130 with a write or read result. For example, the read/write circuit 120 performs a verification operation to detect a result of the write operation when the write operation is performed and may provide the control logic 130 with, for example, a pass or fail (P/F) signal that is output after the verification operation is performed.

The read/write circuit 120 may be selectively connected to the row decoder 150 or the column decoder 160, and accordingly may be selectively connected to the word lines WLs or bit lines BLs so that the read/write circuit 120 may write data to the memory cells or read data therefrom.

The read/write circuit 120 may include the write circuit 121 and the read circuit 122. The write circuit 121 is connected to a selected bit line BL via the column decoder 160 so as to provide a selected memory cell MC with a program pulse, thereby performing a program operation (i.e., the write operation). Thus, the data DATA to be stored to the memory cell array 110 may be input to the write circuit 121. The program pulse may be referred to as a write pulse. According to an exemplary embodiment, the program pulse may be a current pulse. According to another exemplary embodiment, the program pulse may be a voltage pulse.

In detail, the write circuit 121 may perform a set write operation of programming the memory cell MC in a direction in which a resistance of the memory cell MC decreases.

Also, the write circuit 121 may perform a reset write operation of programming the memory cell MC in a direction in which the resistance of the memory cell MC increases.

The read circuit 122 is connected to a selected bit line BL via the column decoder 160 so as to determine a resistance level of the selected memory cell MC, thereby reading stored data DATA. The read circuit 122 senses a voltage of the bit line BL and may determine the resistance level of the selected memory cell MC by comparing the sensed voltage with reference voltages Vref. According to an exemplary embodiment, when the memory cell MC is a multi-level cell, the read circuit 122 may determine the resistance level of the selected memory cell MC by comparing a voltage of the sensed bit line BL with the reference voltages Vref.

The read circuit 122 may perform a normal read operation on the memory cell MC when a read command is received from the memory controller 200. Also, the read circuit 122 performs a read operation on the memory cell MC before the write operation is performed on the memory cell MC and may perform a pre-read operation whereby an initial resistance state of the memory cell MC is read in advance Furthermore, the read circuit 122 may perform a verify read operation whereby it is determined whether writing to the memory cell MC is completed after the write operation is performed on the memory cell MC.

In a normal read operation, the read circuit 122 may provide the read data DATA to the outside of the memory device 100, for example, to the memory controller 200. Also, in a pre-read operation and a verify read operation, the read circuit 122 may provide the read data DATA or a pass/fail signal P/F indicating a success/failure of a write operation as a write/read operation result, to the inside of the memory device 100, for example, to the control logic 130 or the write circuit 121.

According to an exemplary embodiment, the write circuit 121 and the read circuit 122 may be connected to the word line WL. According to another exemplary embodiment, the write circuit 121 and the read circuit 122 may be connected to the bit line BL. According to another exemplary embodiment, the write circuit 121 may be connected to the word line WL, and the read circuit 122 may be connected to the bit line BL. According to another exemplary embodiment, the write circuit 121 may be connected to the bit line BL, and the read circuit 122 may be connected to the word line WL.

The voltage generating unit 140 may generate various types of voltages used to perform write, read, and erase operations on the memory cell array 110 based on a voltage control signal CTRL_vol. The voltage generating unit 140 may generate operation voltages, for example, a set write voltage Vset, a reset write voltage Vreset, a read voltage Vread, and inhibit voltages Vinh, which are used to operate the word lines WLs and the bit lines BLs. Also, the voltage generating unit 140 may generate a reference voltage Vref used to read data stored in the memory cell MC. FIG. 2 illustrates that the voltage generating unit 140 outputs one reference voltage Vref, but the inventive concept is not limited thereto. When data of a multi-level cell is read, a plurality of reference voltages Vref may be sequentially provided to the read circuit 122, and differences between the reference voltages Vref may differ, depending on a resistance state to be determined. As described above with reference to FIG. 1, a difference between the reference voltages Vref used to determine a high resistance state may be greater than a difference between the reference voltages Vref used to determine a low resistance state.

The control logic 130 may write data DATA to the memory cell array 110 or may output various control signals for reading the data DATA from the memory cell array 110, based on the command CMD, the address ADDR, and the control signal CTRL received from the memory controller 200. The control signals output from the control logic 130 may be provided to the read/write circuit 120, the voltage generating unit 140, the row decoder 150, and the column decoder 160, and thus, the control logic 130 may control operations of the memory device 100 overall.

In detail, the control logic 130 may generate operation control signals CTRL_op based on the command CMD and the control signal CTRL and may provide the generated operation control signals CTRL_op to the read/write circuit 120.

Furthermore, the control logic 130 may provide the row address X_ADDR to the row decoder 150 and the column address Y_ADDR to the column decoder 160.

Also, the control logic 130 may generate a voltage control signal CTRL_vol based on the command CMD, the control signal CTRL, and the P/F signal received from the read circuit 122. According to the present exemplary embodiment, the control logic 130 receives, from the host, the control signal CTRL for setting levels of the reference voltages Vref or a difference between the reference voltages Vref, generates the voltage control signal CTRL_vol that controls the levels of the reference voltages Vref, and may provide the generated voltage control signal CTRL_vol to the voltage generating unit 140.

The memory device 100 generates the reference voltages in order to make a difference between reference voltages corresponding to a high resistance state greater than a difference between reference voltages corresponding to a low resistance state, and performs a read operation based on the reference voltages, thereby reducing the occurrence of read errors according to dispersions of the resistance states.

Figure 3:
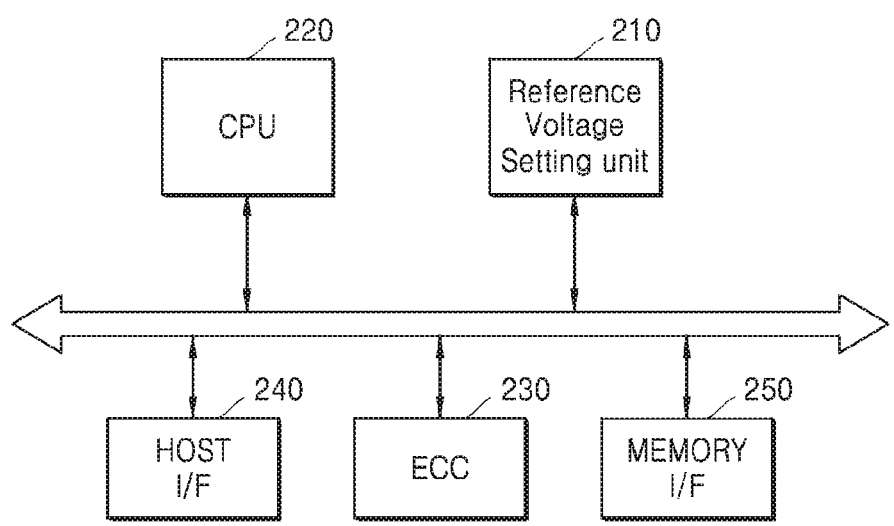
FIG. 3 is a block diagram illustrating an example of a memory controller of FIG. 1.

FIG. 3 is a block diagram of an example of the memory controller 200 of FIG. 1.

Referring to FIG. 3, the memory controller 200 may include a reference voltage setting unit 210, a central processing unit (CPU) 220, an error correction (ECC) unit 230, a host interface 240, and a memory interface 250. Also, although not illustrated in FIG. 3, the memory controller 200 may further include other components, for example, read only memory (ROM) configured to store code data necessary to boot a device including the memory system 10, a buffer memory controller configured to control a buffer memory device, or the like.

The host interface 240 provides an interface between a host and the memory controller 200 and receives a request for a memory operation from the host. For example, the host interface 240 receives, from the host, various requests such as reading, recording, etc. of data and generates internal signals for performing a memory operation on the memory device 100. For example, the memory controller 200 may communicate with the host via various interface protocols, and the interface protocols may be, for example, an advanced technology attachment (ATA), a serial-ATA (SATA), an external SATA (e-SATA), a parallel-ATA, a small computer system interface (SCSI), a serial attached SCSI (SAS), a peripheral component interconnection (PCI), a PCI-express (PCI-E), IEEE 1394, a universal serial bus (USB), an integrated drive electronics (IDE), a secure digital (SD) card, a multimedia card (MMC), an embedded multimedia card (eMMC), a compact flash (CF) card interface, or the like.

The CPU 220 may control overall operations of the memory controller 200 and may control, for example, functional blocks related to memory operations with respect to the memory device 100. Also, the CPU 220 may be configured to operate firmware for controlling the memory controller 200.

The error correction unit 230 may perform ECC encoding for written data and ECC decoding for read data, may produce an error detection result with regard to the data read from the memory device 100, and may perform an error correction operation for the read data. The error correction unit 230 may perform the ECC encoding and decoding for data in a predetermined unit. For example, sector data may be defined as the ECC encoding and decoding.

The error correction unit 230 may perform ECC encoding processing and ECC decoding processing by using an algorithm such as a reed-solomon (RS) code, a hamming code, or a cyclic redundancy code (CRC). The ECC encoding processing includes an operation of generating parity bits based on data to be recorded, and the ECC decoding processing includes an operation of detecting error bits from the read data and an operation of correcting the detected error bits. For example, the error correction unit 230 detects error bits by comparing parities, which are generated and then stored when data is programmed, with parity bits, which are generated when the data is read, and may correct the error bits by performing a predetermined logical operation (e.g., an exclusive OR (XOR)) on the detected error bits.

The error correction unit 230 may be set to have a predetermined error correction rate, and the number of parity bits, which are generated for each piece of data having the same size, may increase in proportion to an increase of the error correction rate. For example, the higher the error correction rate, the more error bits for data having a predetermined size (or an ECC unit) that may be corrected.

FIG. 3 illustrates that the error correction unit 230 is included in the memory controller 200, but the memory device 100 may have functions of the error correction unit 230.

The memory interface 250 may provide an interface between the memory controller 200 and the memory device 100, and for example, write data and read data may be received/transmitted from/to the memory device 100 via the memory interface 250. Also, the memory interface 250 may further provide an interface between the memory controller 200 and a buffer memory device (not shown).

The reference voltage setting unit 210 may set reference voltages used in a read circuit of the memory device 100 when data is read. The reference voltage setting unit 210 may set levels of the reference voltages, differences therebetween, or the like. According to an exemplary embodiment, the reference voltage setting unit 210 generates control signals used to set the levels of the reference voltages and may provide the generated control signals to the memory device 100. The reference voltage setting unit 210 may determine the levels of the reference voltages or may set differences between the reference voltages such that a difference between reference voltages corresponding to a high resistance state may be greater than a difference between reference voltages corresponding to a low resistance state.

According to another exemplary embodiment, when the memory device 100 includes reference cells having resistance levels corresponding to resistance states and generates reference voltages by using the reference cells, and when a program is performed on the reference cells, the reference voltage setting unit 210 may set reference voltages by controlling a difference between voltage levels of reference cells corresponding to a high resistance state to be greater than a difference between voltage levels of reference cells corresponding to a low resistance state. Hereinafter, a method of setting the reference voltages will be described in detail.

Figure 4:
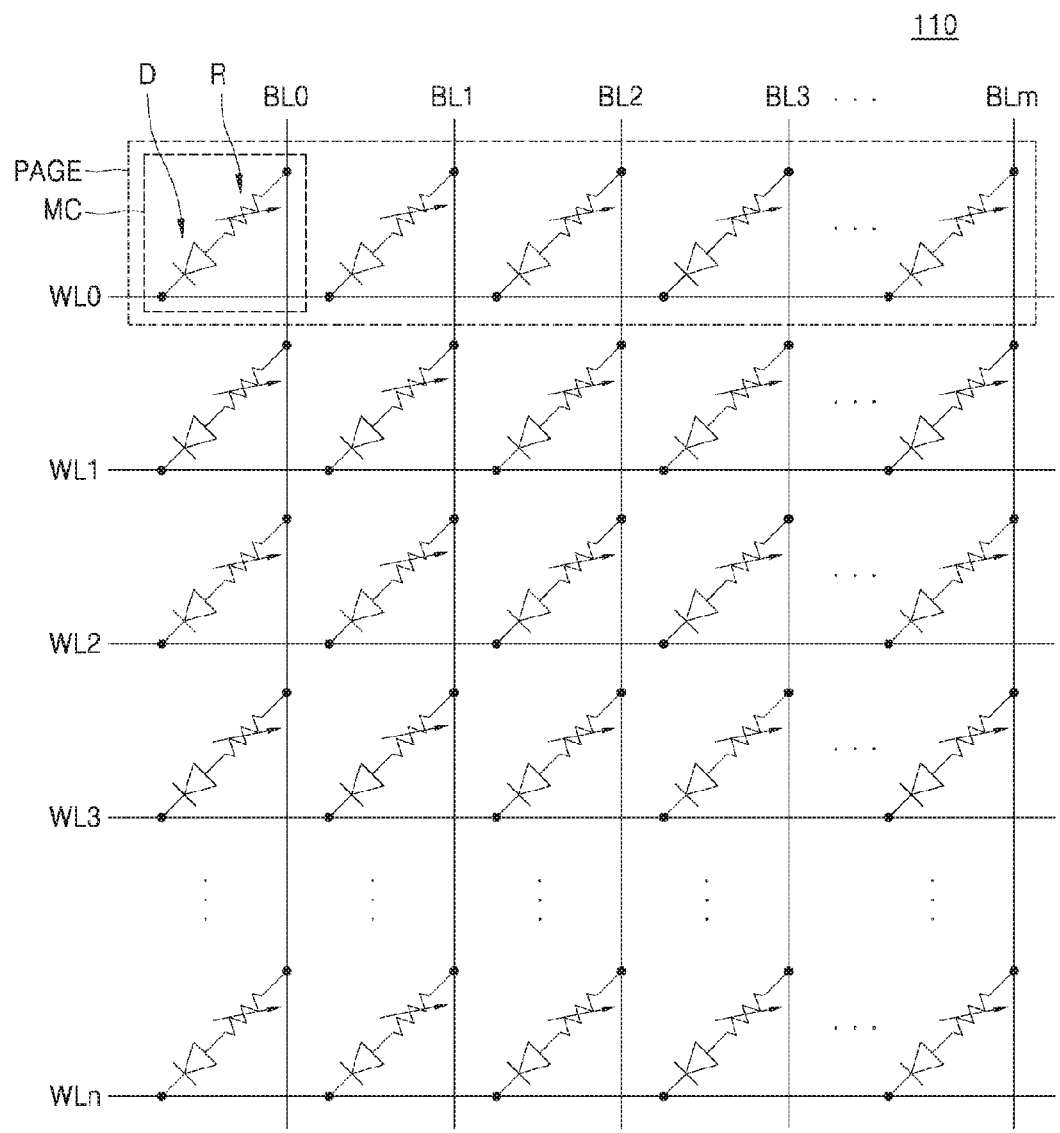
FIG. 4 is a circuit diagram illustrating an example of a memory cell array of FIG. 2.

FIG. 4 is a circuit diagram of an example of the memory cell array 110 of FIG. 2.

Referring to FIG. 4, the memory cell array 110 may be a two-dimensional memory having a horizontal structure and may include word lines WL1 to WLn, bit lines BL1 to BLm, and memory cells MC. It may be defined that memory cells MC selected on the same word line are in a page unit. The number of word lines WL1 to WLn, of bit lines BL1 to BLm, and of memory cells MC may vary according to exemplary embodiments. FIG. 4 illustrates a two-dimensional memory having a horizontal structure, but the inventive concept is not limited thereto. According to another exemplary embodiment, the memory cell array 110 may be a three-dimensional memory having a vertical structure.

In the present exemplary embodiment, each of the memory cells MC may include a variable resistor device R and a selection device D. The variable resistor device R may be referred to as a variable resistor material, and the selection device D may be referred to as a switching device.

According to an exemplary embodiment, the variable resistor device R is connected between one of the word lines WL1 to WLn and the selection device D, and the selection device D is connected between the variable resistor device R and one of the bit lines BL1 to BLm. However, the inventive concept is not limited thereto. The selection device D may be connected between one of the word lines WL1 to WLn and the variable resistor device R, and the variable resistor device R may be connected between the selection device D and one of the bit lines BL1 to BLm.

According to the present exemplary embodiment, the variable resistor device R may be changed to have one of resistance states due to electrical pulses applied to the variable resistor device R. According to an exemplary embodiment, the variable resistor device R may include a phase change material of which a crystalline state changes according to a current amount. The phase change material may use various materials such as GaSb, InSb, InSe. Sb2Te3 and GeTe, in which two elements are combined, GeSbTe, GaSeTe, InSbTe, SnSb2Te4, and InSbGe, in which three elements are combined, or AgInSbTe, (GeSn)SbTe, GeSb (SeTe), and Te81Ge15Sb2S2, in which four elements are combined.

The phase change material may have an amorphous state having a relatively high resistance and a crystal state having a relatively low resistance. A phase of the phase change material may change according to Joule's heat that is generated according to a current amount. Data may be written by using a phase change.

According to another exemplary embodiment, the variable resistor device R may include perovskite compounds, transition metal oxides, magnetic materials, ferromagnetic materials, or anti-ferromagnetic materials, instead of the phase change material.

The selection device D may be connected between the variable resistor device R and any one of the word lines WL1 to WLn and may control provision of a current to the variable resistor device R in accordance with a voltage applied to the connected one of the word lines WL1 to WLn and the bit lines BL1 to BLm. According to an exemplary embodiment, the selection device D may be a PN connection diode or a PIN connection diode. An anode of the diode is connected to the variable resistor device R, and a cathode thereof may be connected to one of the word lines WL1 to WLn. In this case, when a voltage difference between the anode and the cathode is greater than a threshold voltage, the diode is turned on, and a current may be provided to the variable resistor device R. In FIG. 4, the selection device D is a diode, but the inventive concept is not limited thereto. According to another exemplary embodiment, the selection device D may be changed to a switchable device.

Figure 5:
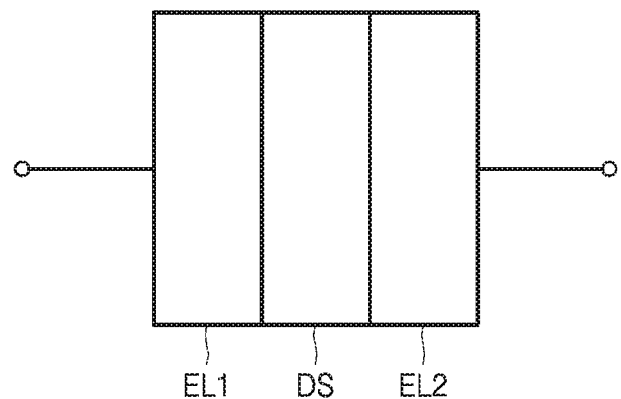
FIG. 5 is a schematic diagram illustrating a variable resistor device included in a memory cell of FIG. 4 according to an exemplary embodiment.

FIG. 5 illustrates the variable resistor device R included in the memory cell MC of FIG. 4 according to an exemplary embodiment.

Referring to FIG. 5, the variable resistor device R may include a first electrode EL1, a second electrode EL2, a data storage film (DS) between the first electrode EL1 and the second electrode EL2.

The first electrode EL1 and the second electrode EL2 may be formed of various metals, metal oxides, or metal nitrides. The first electrode EL1 and the second electrode EL2 may be formed of aluminum (Al), copper (Cu), titanium nitride (TiN), titanium aluminum nitride (TixAlyNz), iridium (Ir), platinum (Pt), silver (Ag), gold (Au), polysilicon, tungsten (W), titanium (Ti), tantalum (Ta), TaN, WN, nickel (Ni), cobalt (Co), chromium (Cr), antimony (Sb), iron (Fe), molybdenum (Mo), palladium (Pd), tin (Sn), zirconium (Zr), zinc (Zn), iridium oxide (IrO2), strontium zirconate oxide (StZrO3), or the like.

The DS may be formed of a bipolar or unipolar resistor storage material. The bipolar resistor storage material may be programmed in a set or reset state due to polarity of pulses and may include a perovskite-based material. The unipolar resistor storage material may be programmed in a set or reset state due to pulses having the same polarity and may include a transition metal oxide such as NiOx or TiOx.

Figure 6A:
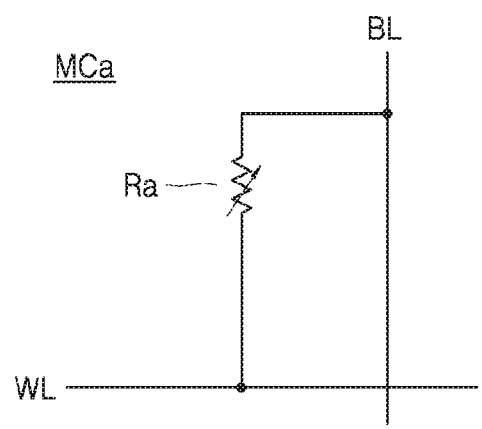
FIGS. 6A through 6C are schematic circuit diagrams illustrating modified examples of the memory cell of FIG. 4.
Figure 6B:
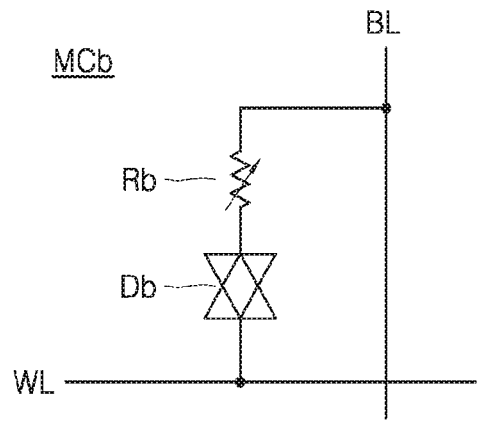
Figure 6C:
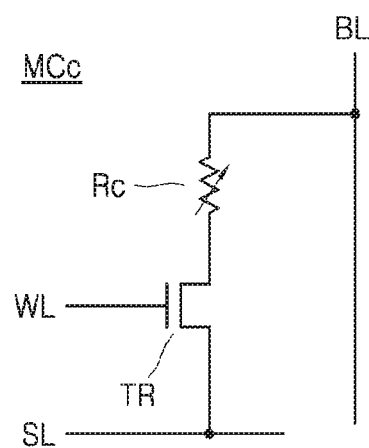

FIGS. 6A through 6C are circuit diagrams of modified examples of the memory cell MC of FIG. 4.

Referring to FIG. 6A, a memory cell MCa may include a variable resistor device Ra that is connected between a bit line BL and a word line WL. The memory cell MCa may store data due to voltages respectively applied to the bit line BL and the word line WL.

Referring to FIG. 6B, a memory cell MCb may include a variable resistor device Rb and a bidirectional diode Db. The variable resistor device Rb may include a resistive material for storing data. The bidirectional diode Db is connected between the variable resistor device Rb and the word line WL, and the variable resistor device Rb may be connected between the bit line BL and the bidirectional diode Db. Positions of the bidirectional diode Db and the variable resistor device Rb may be switched with to each other. A leakage current flowing to a non-selected resistor cell may be cut by the bidirectional diode Db.

Referring to FIG. 6C, a memory cell MCc may include a variable resistor device Rc and a transistor TR. The transistor TR may be a selection device that supplies or blocks a current to the variable resistor device Rc according to a voltage of the word line WL, that is, a switching device. The transistor TR may be connected between the variable resistor device Rc and the word line WL, and the variable resistor device Rc may be connected between a bit line BL and the transistor TR. Positions of the transistor TR and the variable resistor device Rc may be switched with to each other. The memory cell MCc may be selected or not be selected, according to ON or OFF of the transistor TR that is driven by the word line WL.

Figure 7:
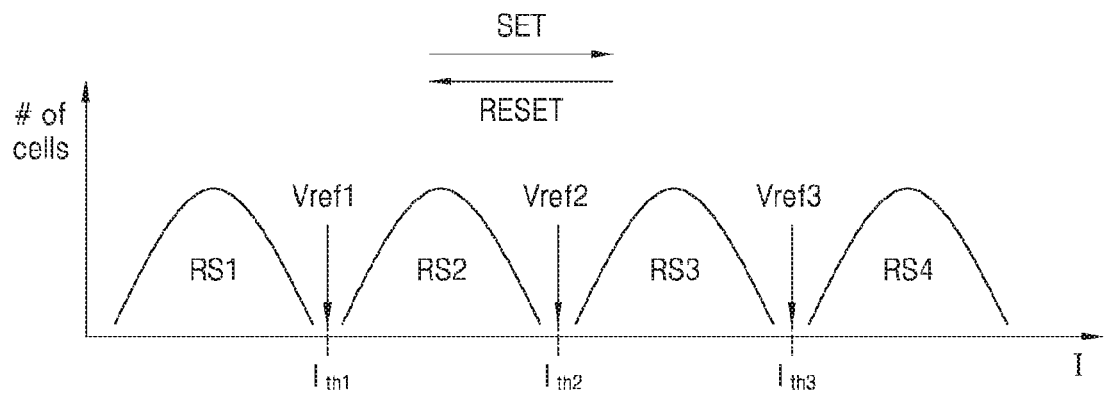
FIG. 7 is a graph showing dispersion of memory cells according to resistance, when the memory cells are multi-level cells.

FIG. 7 is a graph showing dispersion of memory cells MC according to resistance, when the memory cells MC are multi-level cells.

In FIG. 7, a horizontal axis indicates a current flowing to the memory cells MC, and a vertical axis indicates the number of memory cells MC. The current flowing to the memory cells MC is inversely proportional to the resistance. Therefore, the smaller a current value is, the higher a resistance state is, and the greater a current value is, the lower a resistance state is.

Referring to FIG. 7, when a memory cell MC is a multi-level cell MLC that is programmed in 2 bits, the memory cell MC may have one of a first resistance state RS1, a second resistance state RS2, a third resistance state RS3, and a fourth resistance state RS4. Resistance levels of the first resistance state RS1, the second resistance state RS2, the third resistance state RS3, and the fourth resistance state RS4 may decrease in the stated order. In other words, the first resistance state RS1 is a higher resistance state than the second resistance state RS2, the second resistance state RS2 is a higher resistance state than the third resistance state RS3, and the third resistance state RS3 is a higher resistance state than the fourth resistance state RS4.

In FIG. 7, the memory cell MC is a 2-bit multi-level cell MLC, but the inventive concept is not limited thereto. According to another exemplary embodiment, memory cells may include triple-level cells that store 3-bit data and thus have one of eight resistance states, respectively. According to another exemplary embodiment, the memory cells may include memory cells that may respectively store 4-bit or more data.

The first to fourth resistance states RS1 to RS4 may respectively correspond to data '00', data '01', data '10', and data '11'. According to an exemplary embodiment, resistance levels may increase in the stated order of the data '11', the data '01', the data '00', and the data '10'. That is, the fourth resistance state RS4 may correspond to the data '11', the third resistance state RS3 may correspond to the data '01', the second resistance state RS2 may correspond to the data '00', and the first resistance state RS1 may correspond to the data '10'.

An operation of applying a write pulse to the memory cell MC and switching the memory cell MC from a high resistance state to a low resistance state is referred to as a set operation or a set write operation. Also, an operation of applying a write pulse to the memory cell MC and switching the memory cell MC from a low resistance state to a high resistance state is referred to as a reset operation or a reset write operation.

A current corresponding to a resistance level between dispersion according to the first resistance state RS1 and dispersion according to the second resistance state RS2 may be set to a first critical current Ith1, a current corresponding to a resistance level between dispersion according to the second resistance state RS2 and dispersion according to the third resistance state RS3 may be set to a second critical current Ith2, and a current corresponding to a resistance level between dispersion according to the third resistance state RS3 and dispersion according to the fourth resistance state RS4 may be set to a third critical current Ith3. In a read operation performed on the memory cells MC, it is determined that the memory cells MC have one of the second to fourth resistance states RS2 to RS4 when a current flowing to the memory cells MC is equal to or greater than the first critical current Ith1 and that the memory cells MC have the first resistance state RS1 when a result of the read operation is less than or equal to the first critical current Ith1.

In this case, in the memory device (100 of FIG. 2), reference voltages Vref1, Vref2, and Vref3 corresponding to the first to third critical currents Ith1 to Ith3 are generated, and the read circuit 122 may determine resistance states of the memory cells MC based on the reference voltages Vref1, Vref2, and Vref3. For example, the first reference voltage Vref1 may be a reference whereby the first resistance state RS1 is distinguished from other resistance states, for example, the second to fourth resistance states RS2 to RS4. The second reference voltage Vref2 may be a reference whereby the first and second resistance states RS1 and RS2 are distinguished from the third and fourth resistance states RS3 and RS4. The third reference voltage Vref3 may be a reference whereby the fourth resistance state RS4 is distinguished from other resistance states, for example, the first to third resistance states RS1 to RS3. In this case, voltage levels of the first to third reference voltages Vref1 to Vref3 may decrease in the stated order of the first reference voltage Vref1, the second reference voltage Vref2, and the third reference voltage Vref3. The first to third reference voltages Vref1 to Vref3 will be described in detail with reference to FIG. 8.

The first reference voltage Vref1 is used to determine a relatively higher resistance state than the second and third reference voltages Vref2 and Vref3. In other words, it may be understood that the first reference voltage Vref1 corresponds to a high resistance state in comparison with the second and third reference voltages Vref2 and Vref3. It may be understood that the second reference voltage Vref2 corresponds to a high resistance state in comparison with the third reference voltage Vref3. It may be understood that the third reference voltage Vref3 corresponds to a low resistance state in comparison with the first and second reference voltages Vref1 and Vref2.

Information about the first to third reference voltages Vref1 to Vref3 may be received from the memory controller 200. The control logic 130 may set levels of the first to third reference voltages Vref1 to Vref3 and differences between the first to third reference voltages Vref1 to Vref3 in accordance with the information about the first to third reference voltages Vref1 to Vref3.

FIG. 7 illustrates ideal dispersion of the memory cells MC, and in actual dispersion of the memory cells MC, a valley may be formed between two adjacent resistance states, and a sensing margin may not be great. Also, dispersion of the high resistance state may be greater than dispersion of the low resistance state. For example, dispersion of the first resistance state RS1 may be greater than that of the second resistance state RS2, and the dispersion of the second resistance state RS2 may be greater than that of the third resistance state RS3.

Figure 8:
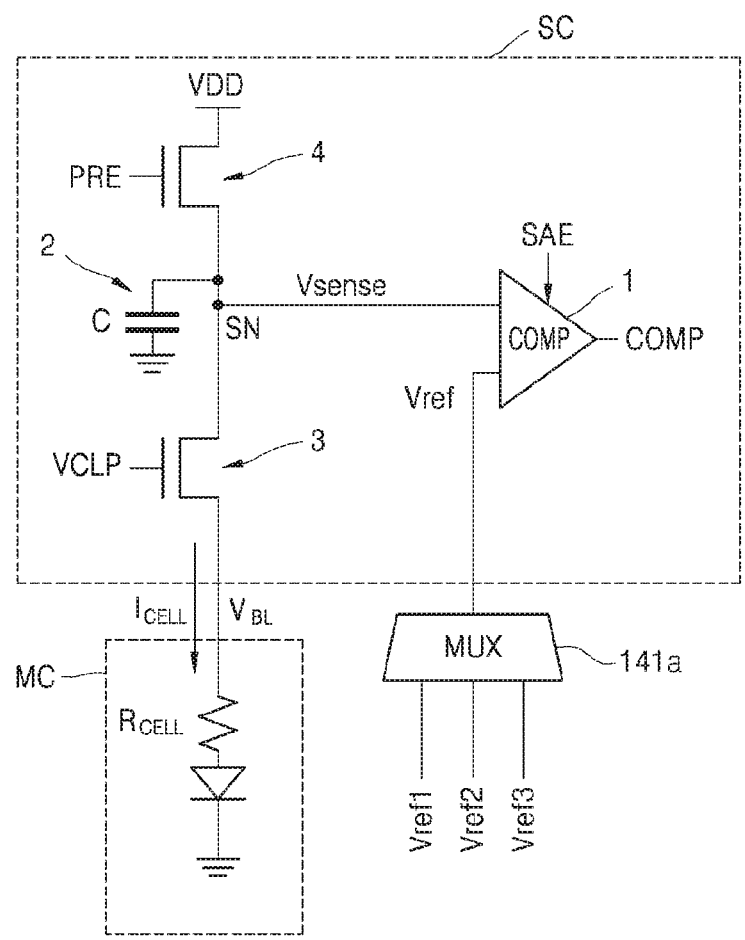
FIG. 8 is a circuit diagram illustrating an example of a read circuit of FIG. 2.

FIG. 8 is a circuit diagram of an example of the read circuit 122 of FIG. 2. For convenience, the memory cell MC and a voltage selection unit 141a included in the voltage generating unit 140 (of FIG. 2) are illustrated.

Referring to FIG. 8, the read circuit 122 may include a sensing circuit SC. For convenience, FIG. 8 illustrates a sensing circuit SC. However, the read circuit 122 may include a plurality of sensing circuits SC connected to bit lines. The sensing circuits SC may read data stored in the memory cell MC based on a sensing voltage $V_{sense}$ at a sensing point. In the present exemplary embodiment, the sensing circuit SC may include a sense amplifier 1, a capacitor 2, a clamping unit 3, and a precharge switch 4. However, a structure of the sensing circuit SC is not limited thereto, and the sensing circuit SC may have a structure in which the data stored at a sensing timing is read. Hereinafter, components of the sensing circuit SC according to the present exemplary embodiment will be described.

When the precharge switch 4 is turned on in response to a precharge enable signal PRE, the capacitor 2 may be precharged. Accordingly, the sensing voltage $V_{sense}$ may maintain a predetermined precharge voltage during a precharge section before the read operation or the sensing operation is performed.

The clamping unit 3 is connected between a sensing node SN and the memory cell MC and may perform clamping in a range appropriate to read a bit line voltage $V_{BL}$. In detail, the clamping unit 3 may perform clamping such that the bit line voltage $V_{BL}$ may be at a predetermined level according to a clamping signal VCLP. In other words, the bit line voltage $V_{BL}$ may be determined based on the clamping signal VCLP.

When the clamping unit 3 is switched on due to the clamping signal VCLP, the sensing node SN is connected to the memory cell MC through the bit line, and accordingly, a cell current $I_{cell}$ flows to the memory cell MC in accordance with the bit line voltage $V_{BL}$ and a resistance level of the memory cell MC.

Thus, the sensing voltage $V_{sense}$ decreases according to time, and a decreasing time of the sensing voltage $V_{sense}$ may be proportional to the resistance level of the memory cell MC. In this case, when the resistance level of the memory cell MC is small, the cell current $I_{cell}$ increases, and thus, a decreasing time of the sensing voltage $V_{sense}$ decreases. When the resistance level of the memory cell MC is high, the cell current $I_{cell}$ decreases and thus, a decreasing time of the sensing voltage $V_{sense}$ increases.

The sense amplifier 1 compares the sensing voltage $V_{sense}$ with the reference voltage Vref and may sense or read the data stored in the memory cell MC according to a voltage comparison result. The sense amplifier 1 may perform a sensing operation at a sensing timing at which a sense amp enable signal SAE is active.

In detail, the sensing voltage $V_{sense}$ is applied to a non-inverting input terminal of the sense amplifier 1, and the reference voltage Vref may be applied to an inverting input terminal of the sense amplifier 1. The sense amplifier 1 provides an output having a logic level '1' when the sensing voltage $V_{sense}$ is greater than the reference voltage Vref and may provide an output having a logic level '0' when the sensing voltage $V_{sense}$ is less than the reference voltage Vref.

The voltage selection unit 141a may sequentially select reference voltages Vref, for example, one of the first to third reference voltages Vref1 to Vref3, which are generated by the voltage generating unit 140 (of FIG. 2) and may provide the sensing circuit SC with the selected reference voltage Vref as a reference voltage Vref. The sense amplifier 1 may output logic levels that are generated after the first to third reference voltages Vref1 to Vref3, which are sequentially provided as a reference voltage Vref, are compared with the sensing voltage $V_{sense}$. Data that is output from the sense amplifier 1 according to the logic levels may correspond to one of the resistance states illustrated in FIG. 7. Accordingly, data corresponding to a resistance state may be output as the data stored in the memory cell MC.

For example, when the resistance level of the memory cell MC corresponds to the third resistance state RS3 illustrated in FIG. 7, the sensing voltage $V_{sense}$ may be greater than the third reference voltage Vref3, but may be less than the first and second reference voltages Vref1 and Vref2. Therefore, a result of comparing the sensing voltage $V_{sense}$ with each of the first to third reference voltages Vref1 to Vref3 may be output as '001', and it may be determined that the resistance level of the memory cell MC is the third resistance state RS3.

In FIG. 8, one bit line is connected to the sense amplifier 1, and the first to third reference voltages Vref1 to Vref3 are sequentially provided to the sense amplifier 1 as the reference voltage Vref, and thus, the resistance level of the memory cell MC is determined through sensing operations. However, the inventive concept is not limited thereto. One bit line is connected to three sense amplifiers, and the first to third reference voltages Vref1 to Vref3 are respectively provided to the sense amplifiers. Thus, the resistance level of the memory cell MC may be determined through one sensing operation.

Figure 9:
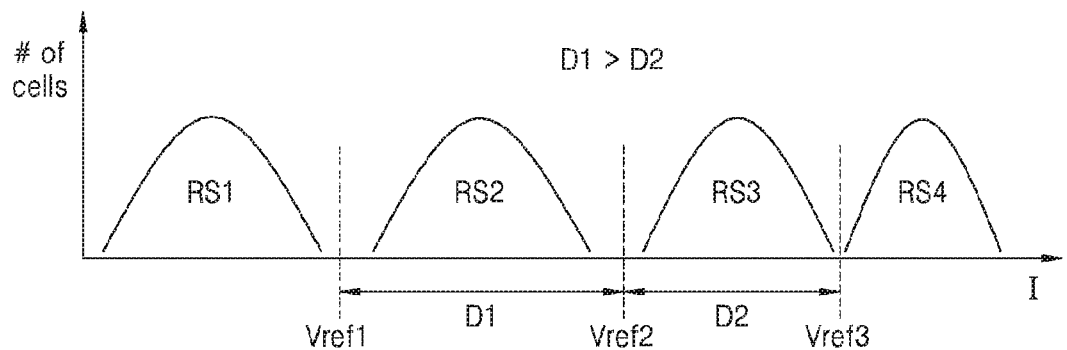
FIG. 9 is a graph illustrating an example of a method of setting a reference voltage of a memory system, according to an exemplary embodiment.

FIG. 9 illustrates an example of a method of setting a reference voltage of the memory system 10, according to an exemplary embodiment.

Referring to FIG. 9, the memory cells are multi-level cells that are programmed in two bits and may have four resistance states, for example, a first resistance state RS1, a second resistance state RS2, a third resistance state RS3, and a fourth resistance state RS4.

As illustrated in FIG. 9, actual dispersion of the memory cells may differ according to the resistance states. As described above, the number of filaments is small in a high resistance state, and thus, dispersion of a resistance level may be relatively greater than a low resistance state.

The memory system 10 (of FIG. 1) may set a difference D1 between reference voltages corresponding to the high resistance state, for example, between the first reference voltage Vref1 and the second reference voltage Vref2, to be greater than a difference D2 between reference voltages corresponding to the low resistance state, for example, between the second reference voltage Vref2 and the third reference voltage Vref3.

FIGS. 10A through 10F illustrate other examples of a method of setting reference voltages of the memory system 10, according to one or more exemplary embodiments. In FIGS. 10A through 10F, the memory cells are triple-level cells that are programmed in three bits and may include eight resistance states RS1 to RS8. In this case, differences between the first to eighth reference voltages Vref1 to Vref8 are referred to as first to sixth voltage differences D1 to D6.

Referring to FIGS. 10A to 10F, the memory system 10 may set a voltage difference corresponding to high resistance states to be greater than a voltage difference corresponding to low resistance states.

Figure 10A:
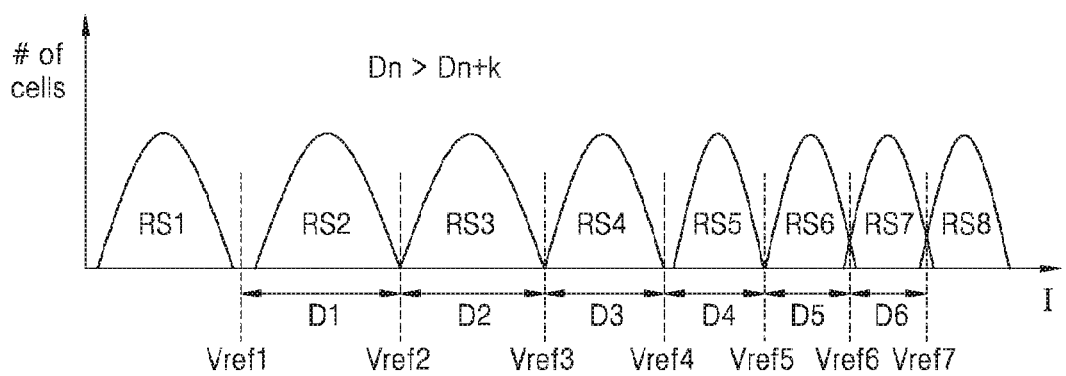
FIGS. 10A through 10F are graphs illustrating other examples of a method of setting reference voltages of a memory system, according to one or more exemplary embodiments.
Figure 10B:
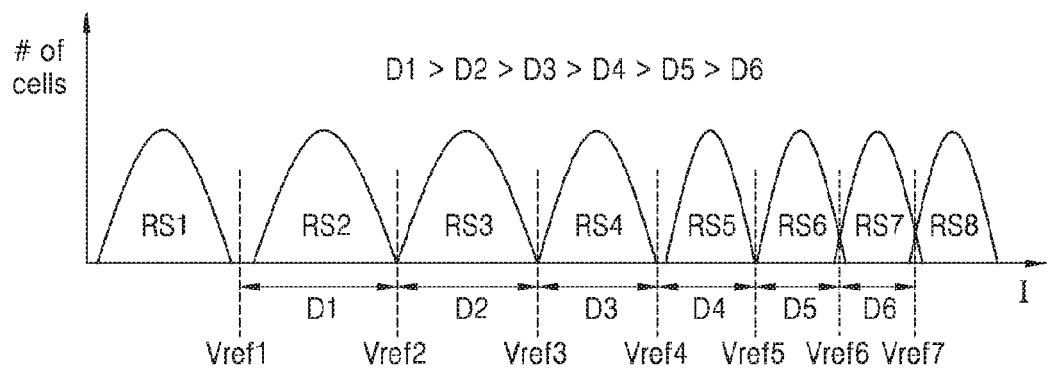

Referring to FIG. 10A, the memory system 10 may set an $n^{th}$ voltage difference Dn to be greater than an $n+k^{th}$ voltage difference Dn+k (where, n and k are natural numbers). Accordingly, as illustrated in FIG. 10B, the first to sixth voltage differences D1 to D6 may differ from each other, and a voltage difference corresponding to the high resistance states may be greater than a voltage difference corresponding to the low resistance states. For example, the first voltage difference D1 is greater than the second voltage difference D2, and the second voltage difference D2 may be greater than the third voltage difference D3.

Figure 10C:
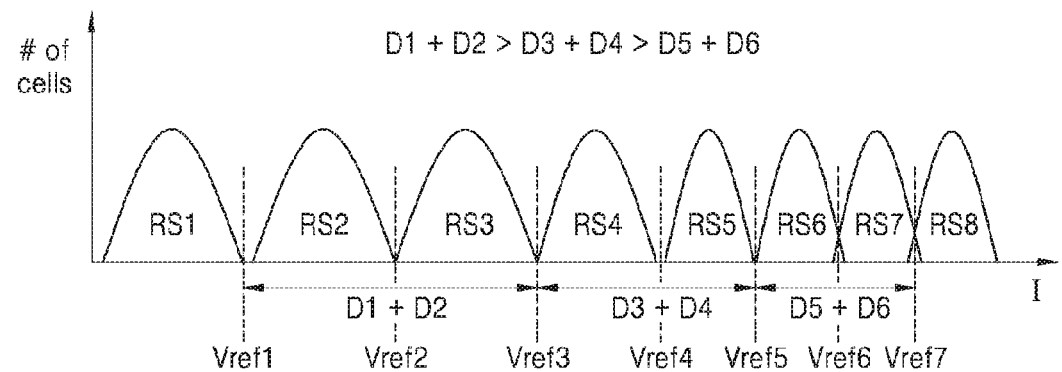

According to another exemplary embodiment, as illustrated in FIG. 10C, a sum of two adjacent voltage differences may be different from another sum of two adjacent voltage differences. In this case, a sum of voltage differences corresponding to the high resistance state may be greater than a sum of voltage differences corresponding to the low resistance state. For example, a sum of the first voltage difference D1 and the second voltage difference D2 may be greater than a sum of the third voltage difference D3 and the fourth voltage difference D4. The sum of the third voltage difference D3 and the fourth voltage difference D4 may be greater than a sum of the fifth voltage difference D5 and the sixth voltage difference D6.

Figure 10D:
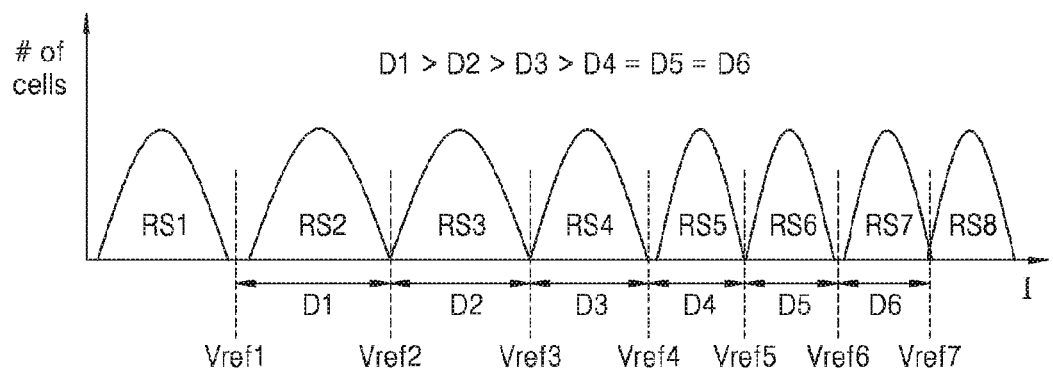

According to another exemplary embodiment, as illustrated in FIG. 10D, the voltage differences corresponding to the high resistance states are differently set, and the voltage differences corresponding to the low resistance states may be identically set. For example, the first to third voltage differences D1 to D3 corresponding to the high resistance states are differently set, and the fourth to sixth voltage differences D4 to D6 may be identically set.

Figure 10E:
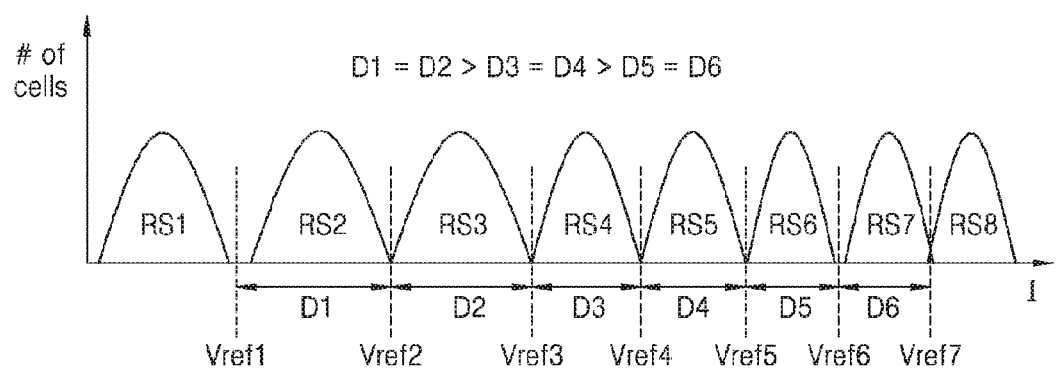

According to another exemplary embodiment, as illustrated in FIG. 10E, a voltage difference corresponding to the high resistance states is set to be greater than a voltage difference corresponding to the low resistance states, but voltage differences corresponding to adjacent resistance states may be identically set. For example, the first and second voltage differences D1 and D2, the third and fourth voltage differences D3 and D4, and the fifth and sixth voltage differences D5 and D6, which correspond to the adjacent resistance states, may be identically set.

Figure 10F:
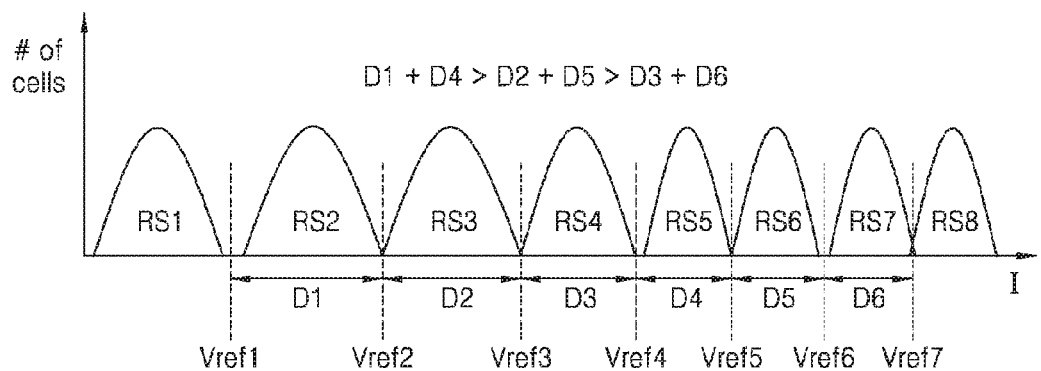

According to another exemplary embodiment, as illustrated in FIG. 10F, a sum of two voltage differences that are not adjacent to each other may be different from a sum of other two voltage differences that are not adjacent to each other. In this case, a sum of voltage differences corresponding to the high resistance state may be greater than a sum of voltage differences corresponding to the low resistance state. For example, a sum of the first voltage difference D1 and the fourth voltage difference D4 may be greater than a sum of the second voltage difference D2 and the fifth voltage difference D5. The sum of the second voltage difference D2 and the fifth voltage difference D5 may be greater than a sum of the third voltage difference D3 and the sixth voltage difference D6.

The examples of setting the voltage differences between the reference voltages have been described. However, the inventive concept is not limited thereto and may include various modified examples of the examples.

Figure 11:
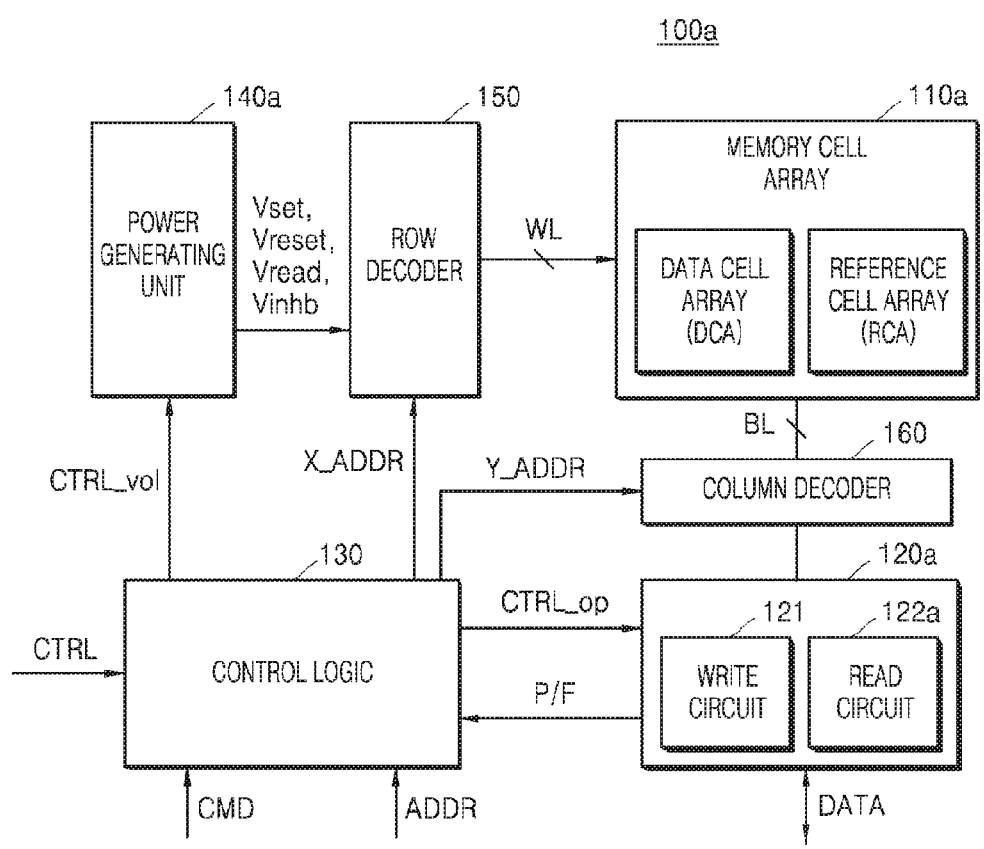
FIG. 11 is a block diagram illustrating an example of the memory device of FIG. 1.

FIG. 11 is a block diagram of an example of the memory device 100a of FIG. 1.

Referring to FIG. 11, the memory device 100a may include a memory cell array 110a, a read/write circuit 120a, a control logic 130, and a power generating unit 140a. Also, the memory device 100a may further include a row decoder 150 and a column decoder 160. In addition, the read/write circuit 120a may include a write circuit 121 and a read circuit 122a.

In the present exemplary embodiment, the memory device 100a may generate reference voltages by programming reference cells of a reference cell array RCA so as to correspond to resistance states and sensing the reference cells. According to an exemplary embodiment, programming the reference cells may be performed once initially.

The memory cell array 110a may include a data cell array DCA and the reference cell array RCA. The reference cell array RCA may include reference cells having resistance levels corresponding to critical resistance states. In this case, the critical resistance states may mean the resistance states in which the critical currents Ith1, Ith2, and Ith3 flow as illustrated in FIG. 7. Accordingly, the memory device 100a may generate reference voltages by sensing voltage levels of the reference cells in the power generating unit 140a.

When data is sensed by using three reference voltages, the reference cell array RCA may include reference cells for providing first to third reference voltages. The memory cells of the data cell array DCA and the reference cells of the reference cell array RCA may have the same cell structure.

When a read operation is performed on the memory cells of the data cell array DCA, information recorded in the reference cells of the reference cell array RCA is also read, and thus the reference voltages may be generated. The generated reference voltages may be provided to a sense amplifier. Voltages of bit lines connected to the reference cells are sensed, and the sensed voltages may be provided to the sense amplifier as reference voltages.

In the present exemplary embodiment, the memory device 100a differently sets differences between voltage levels of the reference cells and thus may differently set differences between reference voltages. A difference between voltage levels of reference cells corresponding to a high resistance state may be greater than a difference between voltage levels of reference cells corresponding to a low resistance state. Detailed descriptions thereof will be provided in detail with reference to FIG. 12.

Figure 12:
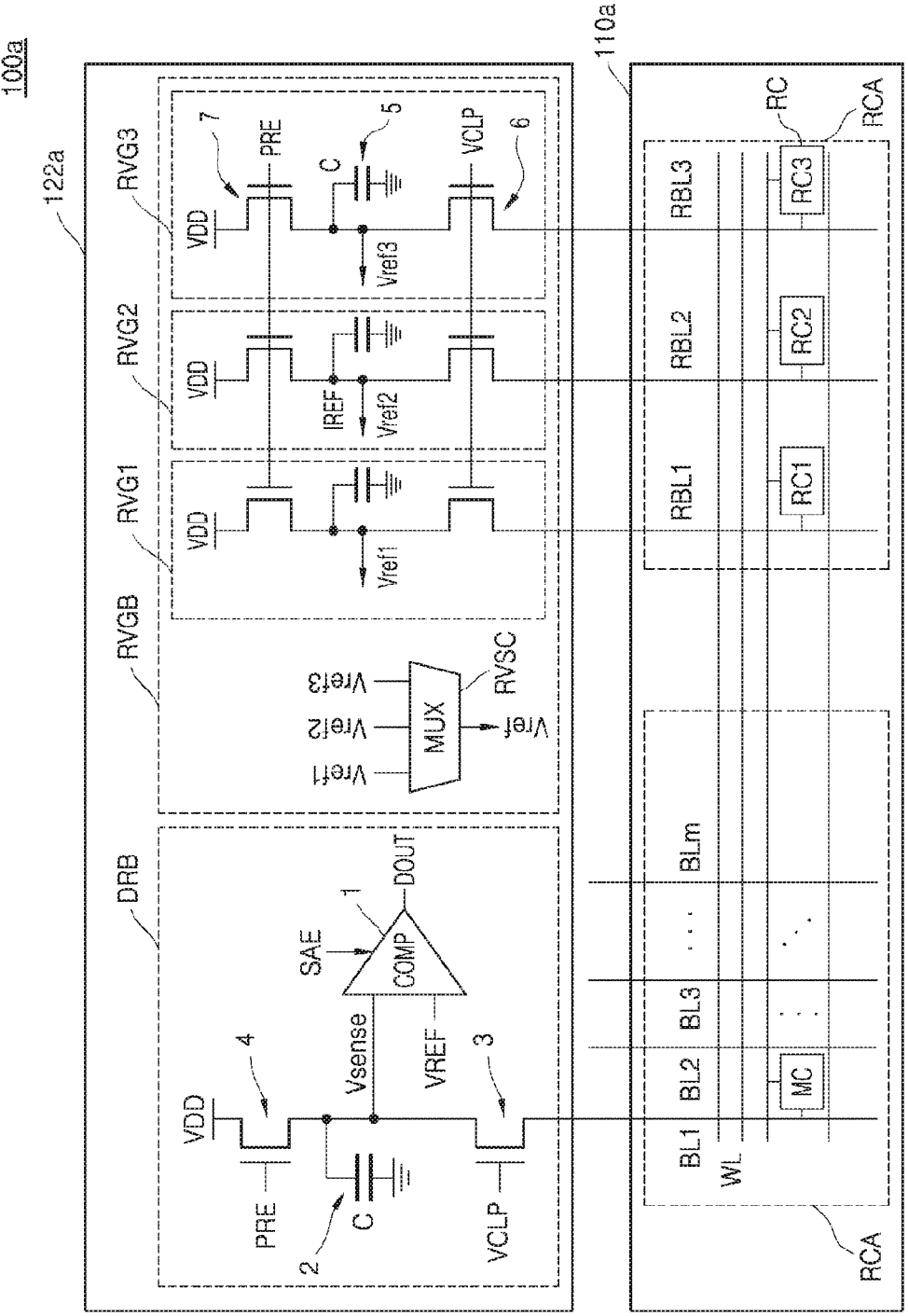
FIG. 12 is a detailed circuit diagram illustrating a memory cell array and a read circuit included in the memory device of FIG. 11.

FIG. 12 is a detailed circuit diagram of the memory cell array 110a and the read circuit 122a included in the memory device 100a of FIG. 11.

Referring to FIG. 12, the memory cell array 110a may include the data cell array DCA and the reference cell array RCA. The memory cell array 110a may include memory cells MC in which data is stored. The reference cell array RCA may include reference cells RCs having resistance levels corresponding to critical resistance states. In the reference cell array RCA, the reference cells RCs may be arranged to correspond to at least some word lines WLs, or to respectively correspond to all word lines WLs. The reference cells RCs may have a cell structure that is the same as the structure of the memory cell MC.

The read circuit 122a may include a data read block DRB and a reference voltage generating block. The data read block DRB may include the sensing circuit SC illustrated in FIG. 8.

The reference voltage generating block RVGB may include a plurality of reference voltage generators RVG1, RVG2, and RVG3. The reference voltage generating block RVGB may further include a reference voltage selection device RVSC. The reference voltage generators RVG1, RVG2, and RVG3 may have a structure that is similar to the structure of the sensing circuit SC. The reference voltage generators RVG1, RVG2, and RVG3 may not include the sense amplifier 1. The reference voltage generators RVG1, RVG2, and RVG3 may each include a precharge switch 7, a capacitor 5, and a clamping unit 6. Operations of the precharge switch 7, the capacitor 5, and the clamping unit 6 are similar to operations of the precharge switch 4, the capacitor 2, and the clamping unit 3 of the sensing circuit SC, which are described with reference to FIG. 8, and thus, repeated descriptions thereof will be omitted.

The reference voltage generators RVG1, RVG2, and RVG3 sense voltages of reference bit lines RBL1, RBL2, and RBL3 connected to reference cells RC1, RC2, and RC3 based on the reference cells RC1, RC2, and RC3, which respectively correspond to the reference voltage generators RVG1, RVG2, and RVG3, and may output the sensed voltages as reference voltages Vref1, Vref2, and Vref3.

Levels of the reference voltages Vref1, Vref2, and Vref3 may be determined in inverse proportion to currents flowing to the reference cells RC1, RC2, and RC3. For example, when a resistance level of the first reference cell RC1 is the highest and a resistance level of the third reference cell RC3 is the lowest, the amount of current flowing to the first reference cell RC1 is the greatest, and the amount of current flowing to the third reference cell RC3 is the smallest. Thus, a level of the first reference voltage Vref1 may be the highest, and a level of the third reference voltage Vref3 may be the lowest.

One of the reference voltages Vref1, Vref2, and Vref3 generated by the reference voltage generators RVG1, RVG2, and RVG3 is selected by the reference voltage selection device RVSC and then may be provided to the sense amplifier 1 as a reference voltage Vref. The reference voltages Vref1, Vref2, and Vref3 are sequentially selected and may be provided to the sense amplifier 1. Accordingly, the sensing circuit SC senses resistance states of the memory cell MC and may read data in accordance with the sensed resistance states.

Since reference voltages may be generated based on resistance levels of the reference cells RCs that are programmed as resistance states, the memory device 100a according to the present exemplary embodiment may differently set differences between the reference voltages by differently setting differences between the voltage levels of the reference cells. A difference between the reference cells corresponding to the high resistance state, for example, a difference between the first reference cell RC1 and the second reference cell RC2, may be set to be greater than a difference between the reference cells corresponding to the low resistance state, for example, a difference between the second reference cell RC2 and the third reference cell RC3. In this case, the memory controller 200 (of FIG. 1) may control programming for the reference cells such that the resistance levels of the reference cells may correspond to the above-described method of setting the reference voltages.

Figure 13:
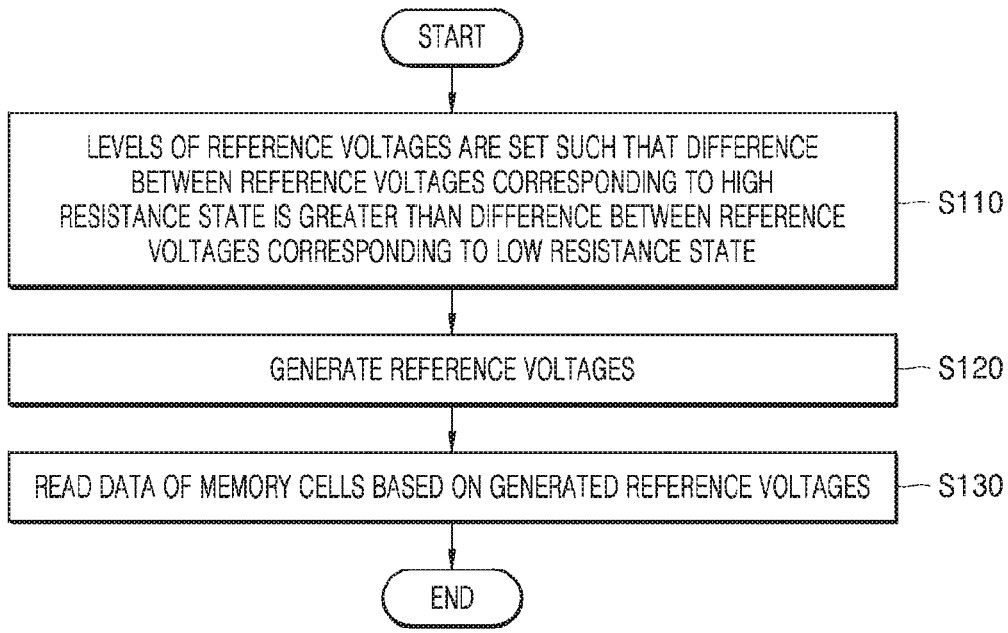
FIG. 13 is a flowchart illustrating a method of operating a memory system according to an exemplary embodiment.

FIG. 13 is a flowchart of a method of operating a memory system, according to an exemplary embodiment.

Referring to FIG. 13, the method of operating the memory system is a method including setting reference voltages and reading data of memory cells. The descriptions provided with reference to FIGS. 1 to 12 apply to the method of operating the memory system according to the present exemplary embodiment.

In the method of operating the memory system according to the present exemplary embodiment, levels of a plurality of reference voltages may be set in operation S110. In operation S110, levels of the reference voltages may be set such that a difference between reference voltages corresponding to high resistance states may be greater than a difference between reference voltages corresponding to low resistance states.

According to an exemplary embodiment, when the reference cells for generating the reference voltages are programmed to correspond to resistance states, a programming operation performed on the reference cells may be controlled such that differences between the resistance levels of the reference cells are differently set and a difference between levels of the reference cells corresponding to the high resistance state may be greater than a difference between levels of the reference cells corresponding to the low resistance state.

In operation S120, reference voltages may be generated according to the set voltage levels. The reference voltages may be generated by the voltage generating unit 140 included in the memory device 100 (of FIG. 2). According to another exemplary embodiment, the memory device 100 (of FIG. 2) may generate the reference voltages by sensing the reference cells of the reference cell array.

Data of the memory cells may be read based on the reference voltages in operation S130. The memory cells are sequentially sensed multiple times with respect to each of the reference voltages, or simultaneously sensed with respect to all of the reference voltages, and thus, the data of the memory cells may be read.

Figure 14:
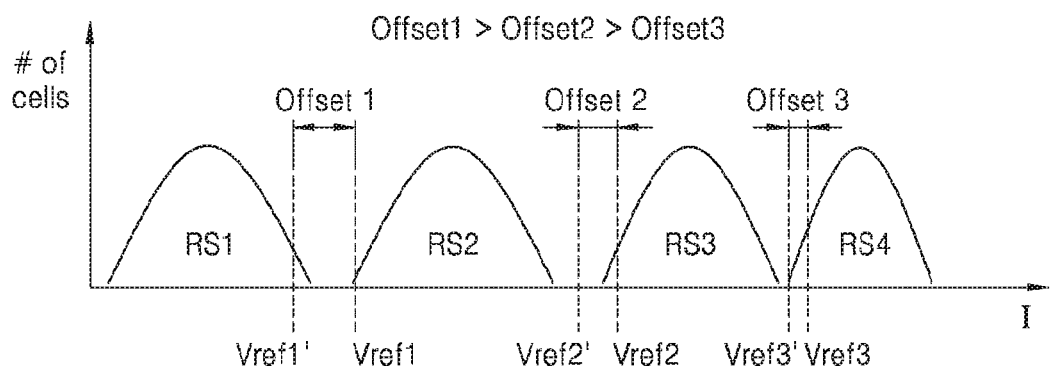
FIG. 14 is a graph illustrating another example of a method of setting reference voltages of a memory system according to an exemplary embodiment.
Figure 15:
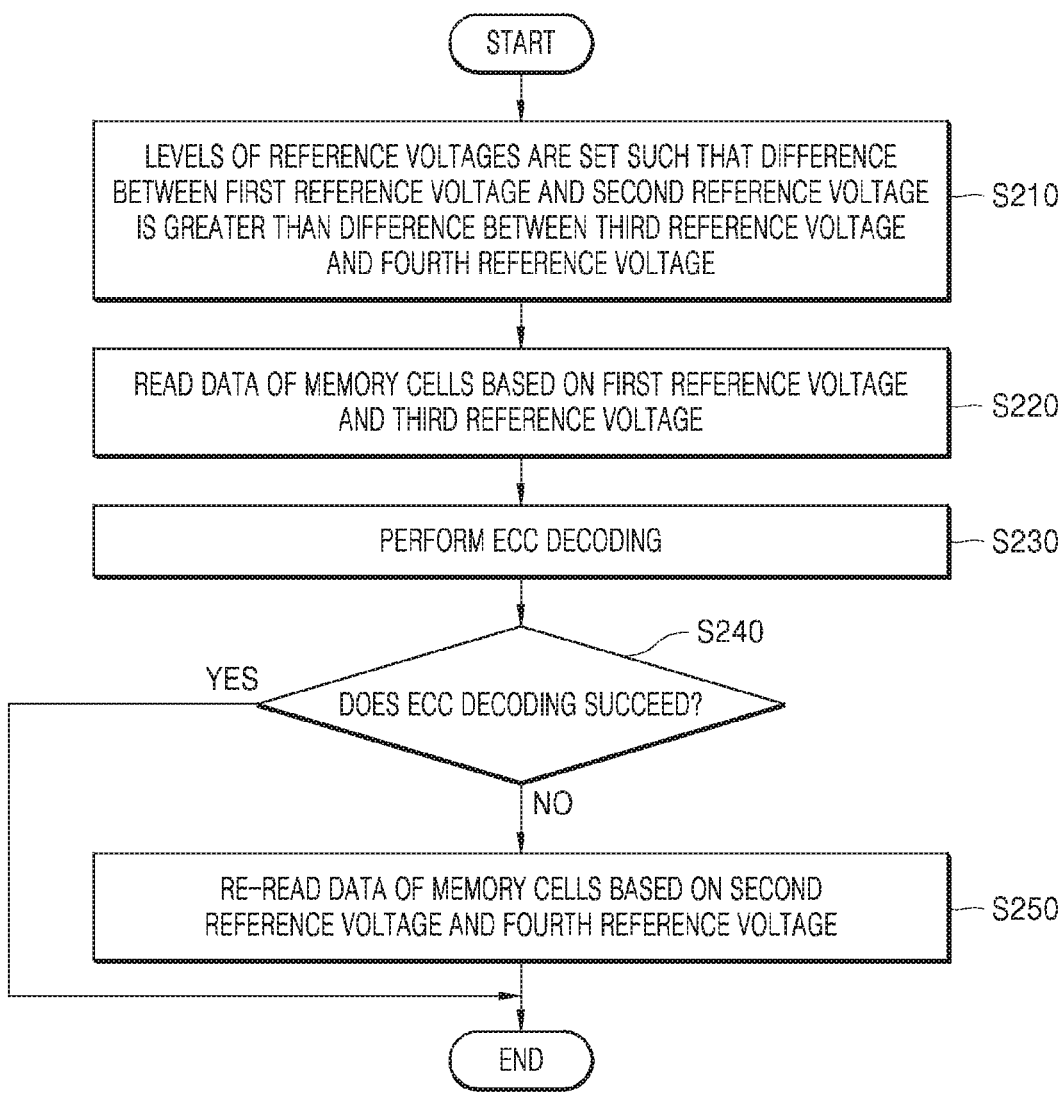
FIG. 15 is a flowchart illustrating a method of operating a memory system, the method including the method of FIG. 14 of setting the reference voltages of the memory system.

FIG. 14 illustrates another example of a method of setting reference voltages of a memory system according to an exemplary embodiment. FIG. 15 is a flowchart of a method of operating a memory system, the method including the method of FIG. 14.

Referring to FIG. 15, in operation S210, levels of the reference voltages may be set such that a difference between a first reference voltage and a second reference voltage may be greater than a difference between a third reference voltage and a fourth reference voltage. In this case, the first reference voltage may be a reference voltage Vref1 of FIG. 14, and the second reference voltage may be a reference voltage Vref1'. The third reference voltage may be a reference voltage Vref2, and the fourth reference voltage may be a reference voltage Vref2'. The difference between the first reference voltage and the second reference voltage may be an offset1, and the difference between the third reference voltage and the fourth reference voltage may be an offset2.

According to another exemplary embodiment, the first reference voltage may be the reference voltage Vref2, and the second reference voltage may be the reference voltage Vref2'. The third reference voltage may be a reference voltage Vref3, and the fourth reference voltage may be a reference voltage Vref3'. The difference between the first reference voltage and the second reference voltage may be an offset2, and a difference between the third reference voltage and the fourth reference voltage may be an offset3.

Referring to FIG. 14, the first reference voltage and the third reference voltage are normal reference voltages, and the second reference voltage and the fourth reference voltage are offset reference voltages of the first reference voltage and the third reference voltage. The offset reference voltages may be set such that offset voltages corresponding to a high resistance state may be greater than offset voltages corresponding to a low resistance state. For example, levels of the reference voltages Vref1, Vref1', Vref2, Vref2', Vref3, and Vref3' may be set such that the offset voltage offset 1 is greater than the offset voltage offset 2, and the offset voltage offset 2 is greater than the offset voltage offset 3. A difference between the reference voltages Vref1 and Vref2 may be greater than a difference between the reference voltages Vref2 and Vref3.

In operation S220, data of the memory cells is read based on the first reference voltage and the third reference voltage. In other words, the data of the memory cells may be read based on the normal reference voltages.

ECC decoding is performed for the read data in operation S230, and whether the ECC decoding succeeds is determined in operation S240. If the ECC decoding fails, the data of the memory cells is re-read based on the second reference voltage and the fourth reference voltage, in operation S250. In other words, the data of the memory cells is re-read based on the offset reference voltages.

Referring to FIGS. 14 and 15, according to the method of operating the memory system, the data is read based on the normal reference voltages Vref1, vref2, Vref3, and when the ECC decoding for the read data fails, the data is re-read based on the offset reference voltages Vref1', Vref2', and Vref3'. In this case, differences between the normal reference voltages and the offset reference voltages may differ according to the resistance states. The offset voltages corresponding to the high resistance state may be set to be greater than the offset voltages corresponding to the low resistance state.

Figure 16:
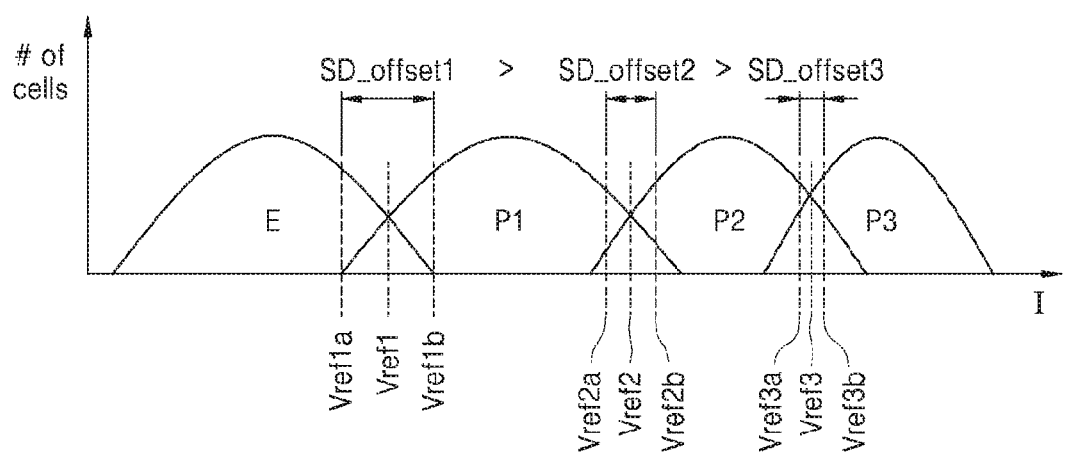
FIG. 16 is a graph illustrating another example of a method of setting reference voltages of a memory system according to an exemplary embodiment.
Figure 17:
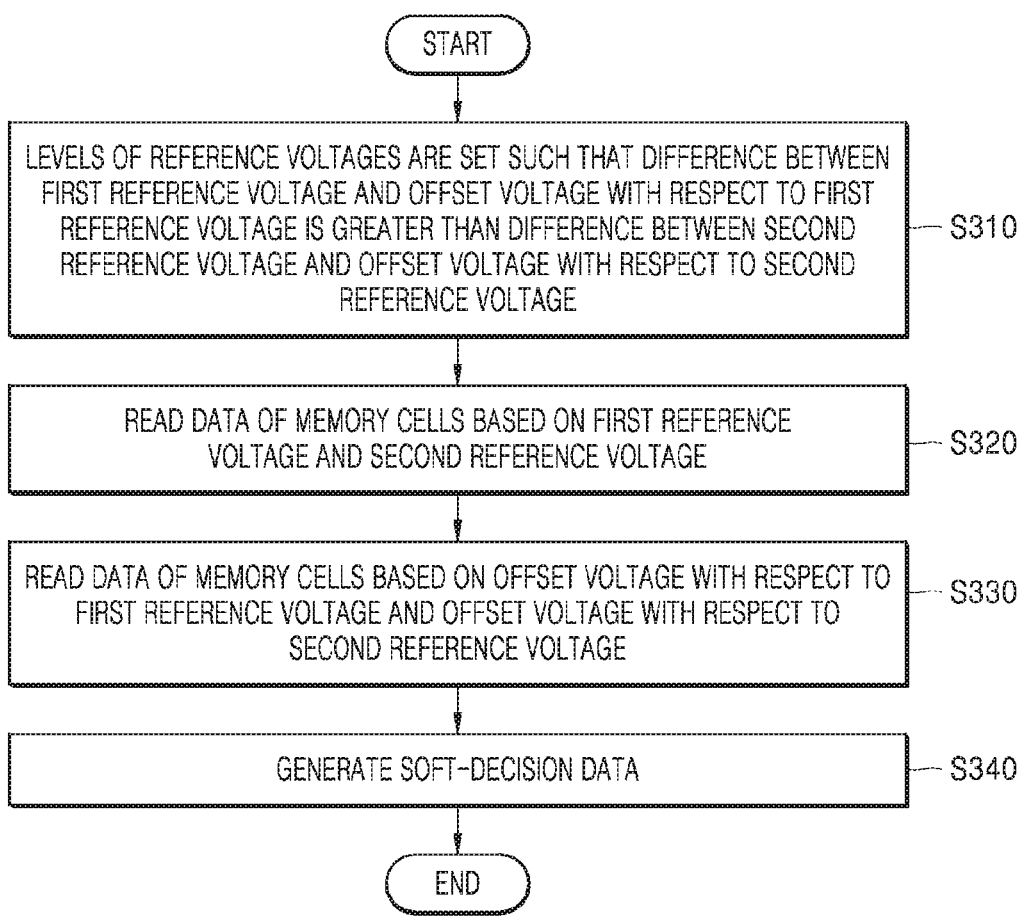
FIG. 17 is a flowchart illustrating a method of operating a memory system, the method including the method of FIG. 16.

FIG. 16 illustrates another example of a method of setting reference voltages of a memory system, according to an exemplary embodiment, and FIG. 17 is a flowchart of a method of operating a memory system, the method including the method of FIG. 16. FIG. 16 illustrates a method of setting the reference voltages in order to perform a soft decision.

Referring to FIG. 17, in operation S310, levels of the reference voltages are set such that a difference between a first reference voltage and an offset voltage with respect to the first reference voltage is greater than a difference between a second reference voltage and an offset voltage with respect to the second reference voltage. In this case, the first reference voltage and the second reference voltage are hard-decision reference voltages, and offset voltages may be soft-decision reference voltages.

According to an exemplary embodiment, the first reference voltage and the second reference voltage are the reference voltages Vref1 and Vref2 of FIG. 16, the offset voltage with respect to the first reference voltage is a reference voltage Vref1a or Vref1b, and the offset voltage with respect to the second reference voltage is a reference voltage Vref2a or Vref2b. A difference SD_offset1 between the reference voltage Vref1 and the reference voltage Vref1a or Vref1b may be set to be greater than a difference SD_offset2 between the reference voltage Vref2 and the reference voltage Vref2a or Vref2b.

According to another exemplary embodiment, the first reference voltage and the second reference voltage are reference voltages Vref2 and Vref3, the offset voltage with respect to the first reference voltage may be a reference voltage Vref2a or Vref2b, and the offset voltage with respect to the second reference voltage may be a reference voltage Vref3a or Vref3b. A difference SD_offset2 between the reference voltage Vref2 and the reference voltage Vref2a or Vref2b may be set to be greater than a difference SD_offset3 between the reference voltage Vref3 and the reference voltage Vref3a or Vref3b.

Referring back to FIG. 17, in operation S320, the data of the memory cells is read based on the first reference voltage and the second reference voltage. In other words, the data of the memory cells is read based on the hard-decision reference voltages. For example, the data of the memory cells may be read based on the reference voltages Vref1, Vref2, and Vref3.

In operation S330, the data of the memory cells is read based on the offset voltages with respect to the first reference voltage and the second reference voltage. In other words, the data of the memory cells is read based on the soft-decision reference voltages, and the data of the memory cells may be read based on the reference voltages Vref1a, Vref2a, and Vref3a or the reference voltages Vref1b, Vref2b, and Vref3b.

Soft-decision data is generated in operation S340. The soft-decision data may be generated based on the data read in operations S320 and S330.

According to the method of operating the memory system according to the present exemplary embodiments described with reference to FIGS. 16 and 17, when the reference voltages for performing the soft-decision are generated, offset values of soft-decision read voltages, that is, differences between the hard-decision reference voltages and the soft-decision reference voltages, may be large when a resistance state is high.

Figure 18:
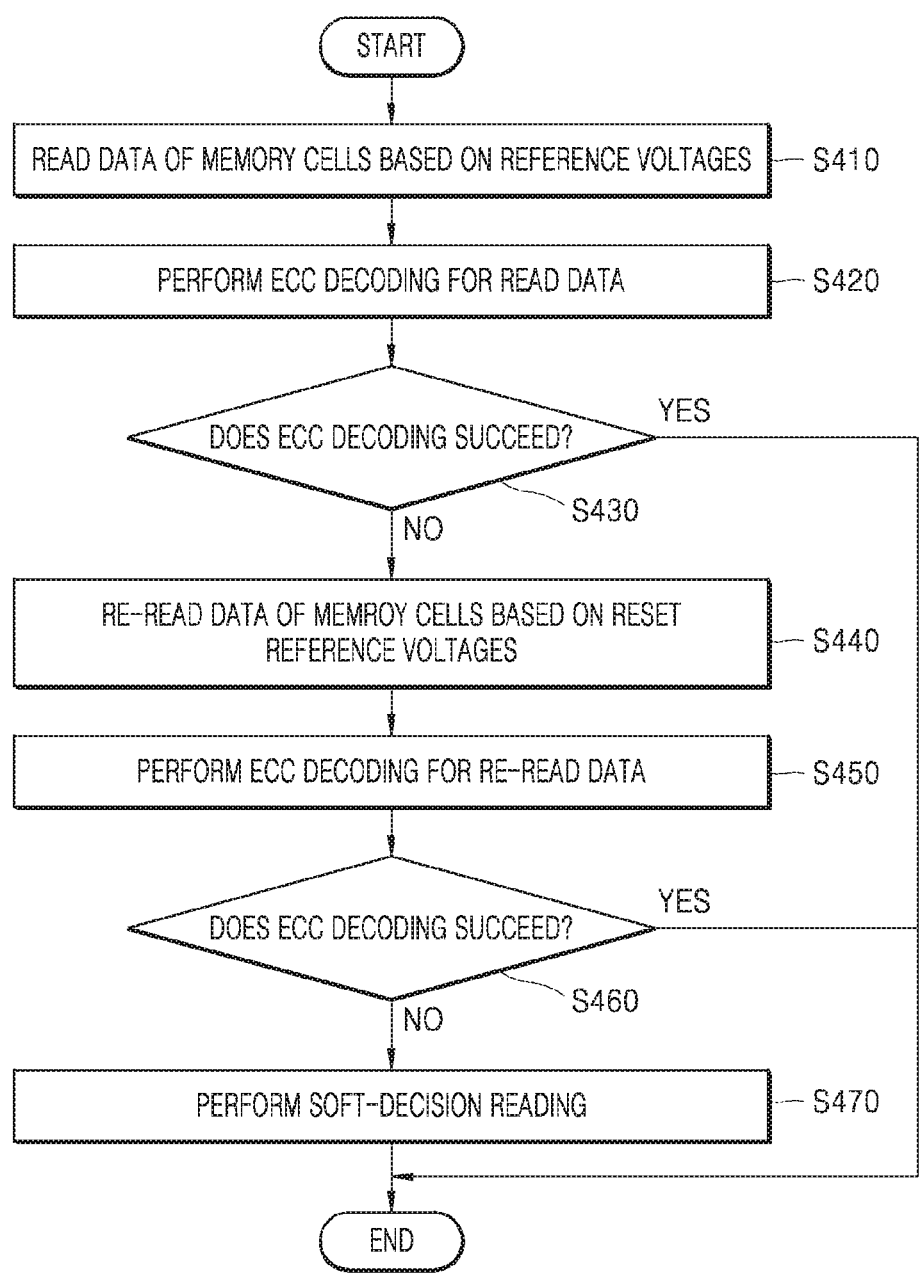
FIG. 18 is a flowchart illustrating a method of operating a memory system according to an exemplary embodiment.

FIG. 18 is a flowchart of a method of operating a memory system, according to an exemplary embodiment.

Referring to FIG. 18, in operation S410, data of the memory cells is read based on reference voltages. ECC decoding is performed for the read data in operation S420, and whether the ECC decoding succeeds is determined in operation S430. If the ECC decoding fails, the data of the memory cells is re-read based on reset reference voltages in operation S440. In this case, the difference between the reset reference voltages and the existing reference voltages may be set as illustrated in FIG. 14. Differences between reference voltages corresponding to the high resistance state may be greater than differences between reference voltages corresponding to the low resistance state.

In operation S450, the ECC decoding is performed for the data that is re-read, and whether the ECC decoding succeeds is determined in operation S430. If the ECC decoding fails, soft-decision reading is performed in operation S470. In this case, levels of the reference voltages for the soft-decision reading may be set as illustrated in FIG. 16.

Figure 19:
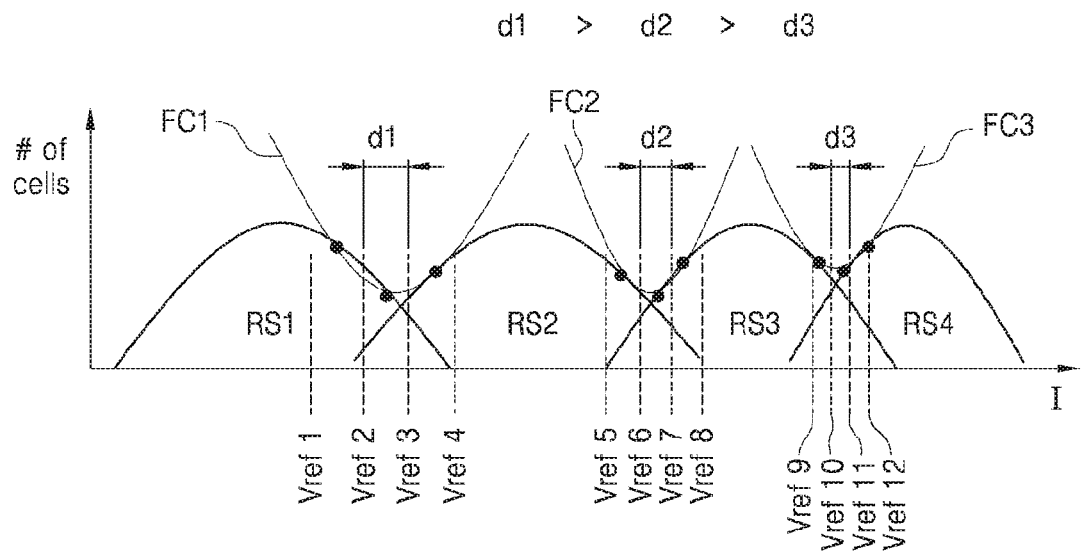
FIG. 19 is a graph illustrating another example of a method of setting reference voltages of a memory system according to an exemplary embodiment.
Figure 20:
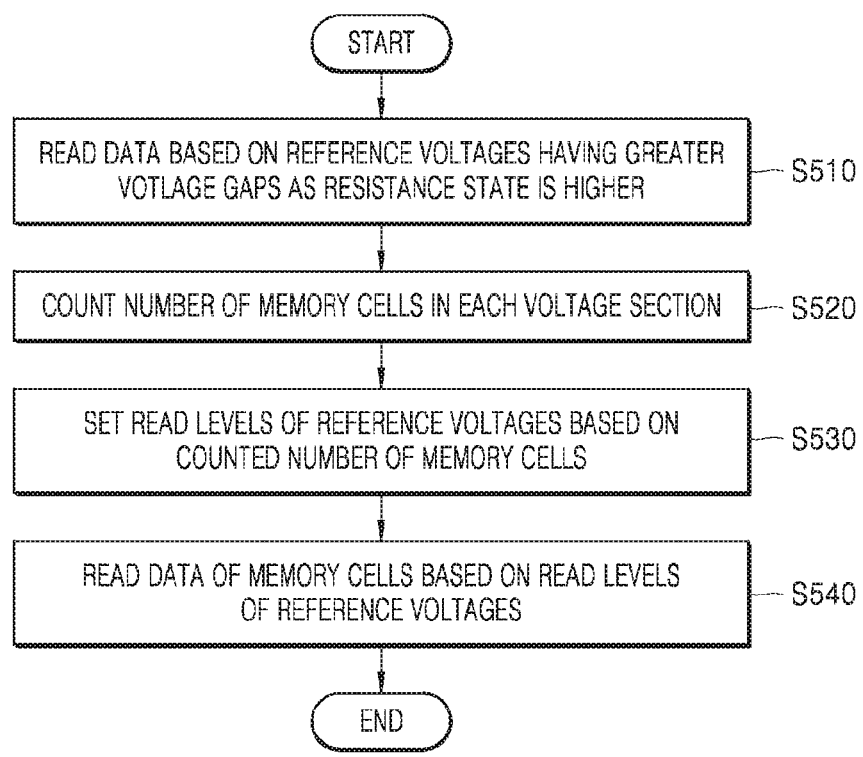
FIG. 20 is a flowchart illustrating a method of operating a memory system, the method including the method of FIG. 19.

FIG. 19 illustrates another example of a method of setting reference voltages of a memory system, according to an exemplary embodiment, and FIG. 20 is a flowchart of a method of operating a memory system, the method including the method of FIG. 19. FIG. 19 illustrates a method of finding optimal reference voltages by finding valleys between dispersions of resistance states. In FIG. 19, the memory cells are 2-bit multi-level cells and include four resistance states RS1, RS2, RS3, and RS4, and it is assumed that four reference voltages are used for respective valleys to find valleys between the dispersions of the resistance states.

Referring to FIGS. 19 and 20, in operation S510, data is read based on reference voltages having greater voltage gaps as a resistance state is higher. The voltage gaps of the reference voltages with respect to the same resistance state are constant, and as the resistance state is higher, the voltage gaps of the reference voltages may be greater. For example, voltage gaps of first to fourth reference voltages Vref1 to Vref4, voltage gaps of fifth to eighth reference voltages Vref5 to Vref8, and voltage gaps of ninth to twelfth reference voltages Vref9 to Vref12 are constant as d1, d2, and d3. A voltage gap d1 may be greater than voltage gaps d2 and d3, and the voltage gap d2 may be greater than the voltage gap d3. The data may be read multiple times based on each of the first to twelfth reference voltages Vref1 to Vref12.

The number of memory cells in each voltage section is counted in operation S520. Based on the data that is read based on the first to twelfth reference voltages Vref1 to Vref12, the number of memory cells in each voltage section or resistance level section may be counted.

Based on the number of memory cells, optimal levels of the reference voltages may be set in operation S530. In this case, the optimal levels of the reference voltages are levels at which an error occurrence probability is the lowest when resistance states are classified during the reading of the data and may mean voltage levels of the reference voltages corresponding to valleys between dispersions of the resistance states. The optimal levels of the reference voltages will be referred to as read levels of the reference voltages. Based on the number of memory cells in each voltage section (or each resistance section), a polynominal function, for example, a quadratic function such as a first to third function FC1 to FC3, may be calculated, and voltage levels corresponding to the lowest values of the first to third functions FC1 to FC3 may be set to the read levels of the reference voltages.

In operation S540, the data of the memory cells is read based on the read levels of the reference voltages.

According to the method of operating the memory system according to the present exemplary embodiments described with reference to FIGS. 19 and 20, when the number of memory cells in the voltage sections is counted to find the read levels of the reference voltages, voltage sections corresponding to a high resistance state have greater areas than voltage sections corresponding to a low resistance state, and thus, the optimal voltage levels may be found by reflecting difference between dispersions of the resistance states.

Figure 21:
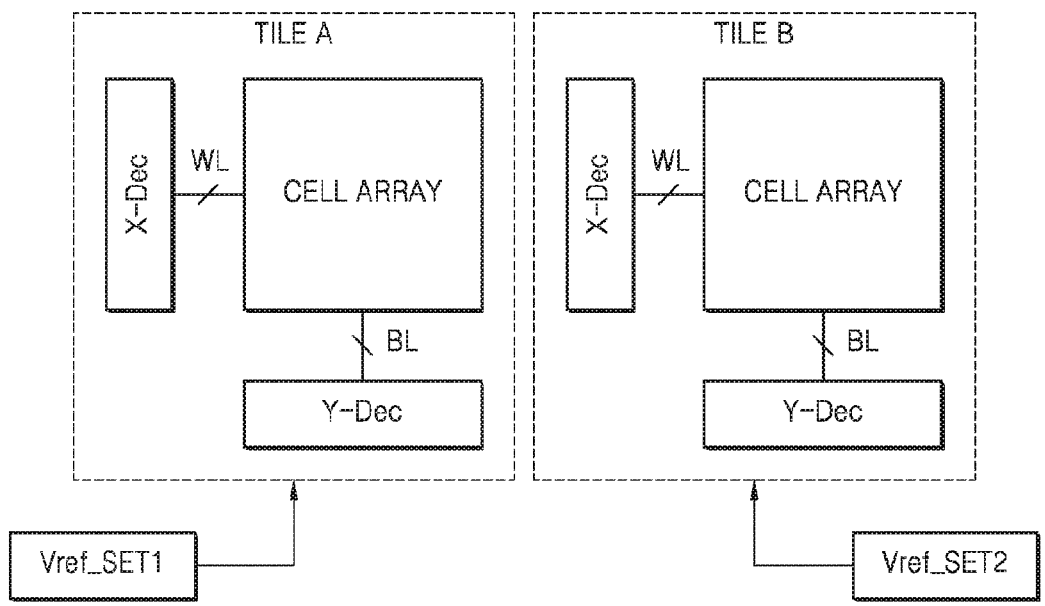
FIG. 21 is a block diagram illustrating application examples in tiles, according to an exemplary embodiment.

FIG. 21 is a block diagram of application examples in tiles, according to an exemplary embodiment.

Referring to FIG. 21, memory cell arrays may be defined by tiles. For example, a tile may include a plurality of memory cells, and word and bit lines WLs and BLs which are connected to the memory cells. Also, the tile may include a row decoder connected to the word lines WLs and a column decoder connected to the bit lines BLs. FIG. 21 illustrates a tile A and a tile B.

Different reference voltage sets Vref_SET1 and Vref_SET2 may be provided to the tile A and the tile B. In the tile A and the tile B, read operations may be independently performed based on the different reference voltage sets Vref_SET1 and Vref_SET2. In this case, at least one of the reference voltage sets Vref_SET1 and Vref_SET2 provided to the tile A and the tile B may be set to have levels such that the difference between the reference voltages corresponding to the high resistance state is greater than the difference between the reference voltages corresponding to the low resistance state. The present exemplary embodiment may be advantageously applied to a case where dispersions of resistance levels in tiles are similarly changed.

Figure 22:
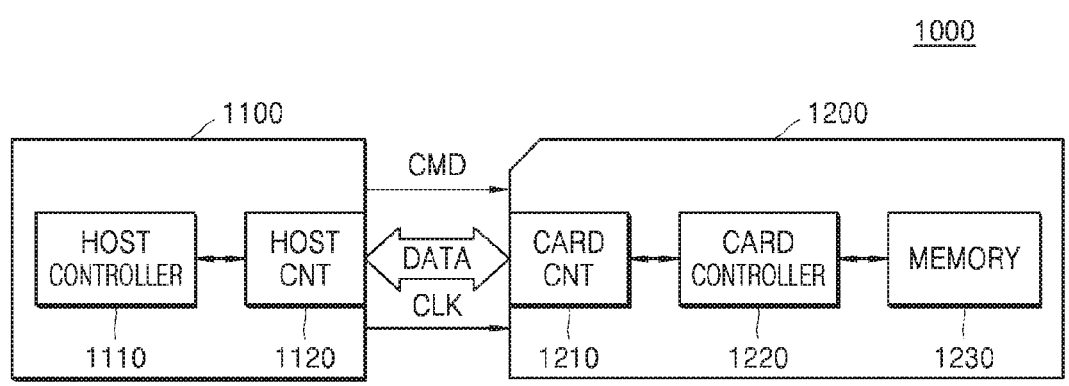
FIG. 22 is a block diagram illustrating an example in which a memory system according to one or more exemplary embodiments is applied to a memory card system.

FIG. 22 is a block diagram of an example in which a memory system according to one or more exemplary embodiments is applied to a memory card system 1000, according to an exemplary embodiment.

Referring to FIG. 22, the memory card system 1000 may include a host 1100 and a memory card 1200. The host 1100 may include a host controller 1110 and a host connecting unit 1120. The memory card 1200 may include a card connecting unit 1210, a card controller 1220, and a memory 1230. In this case, the memory card 1200 may be implemented using the exemplary embodiments described with reference to FIGS. 1 to 21.

The host 1100 may write data to the memory card 1200 or read data stored in the memory card 1200. The host controller 1110 may transmit, to the memory card 1200, a command CMD, clock signals CLK generated by a clock generator (not shown) included in the host 1100, and data DATA via the host connecting unit 1120.

In response to a command CMD received via the card connecting unit 1210, the card controller 1220 may store the data DATA to the memory 1230 in synchronization with clock signals CLK, which are generated by a clock generator (not shown) included in the card controller 1220. The memory 1230 may store the data DATA transmitted by the host 1100.

The memory card 1200 may be, for example, a compact flash card (CFC), a microdrive, a smart media card (SMC), an MMC, a security digital card (SDC), a memory stick, a USB flash memory, or the like.

Figure 23:
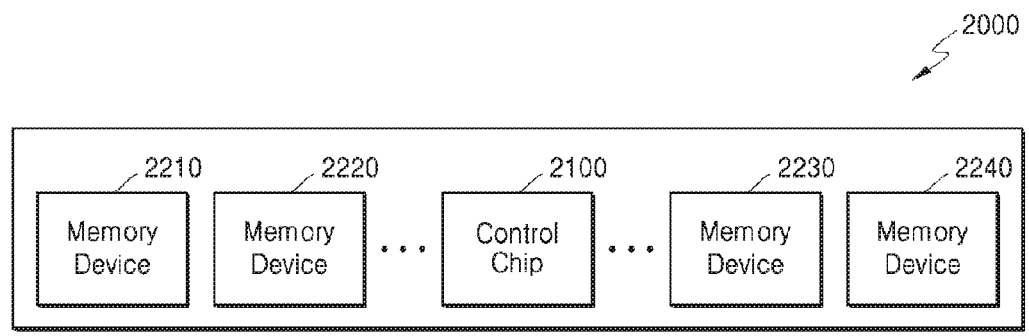
FIG. 23 is a block diagram illustrating a resistive memory module according to an exemplary embodiment.

FIG. 23 illustrates a resistive memory module 2000 according to an exemplary embodiment. Referring to FIG. 23, the resistive memory module 2000 may include memory devices 2210 to 2240 and a control chip 2100. The memory devices 2210 to 2240 may be implemented using the exemplary embodiments described with reference to FIGS. 1 to 21.

The control chip 2100 may control the memory devices 2210 to 2240 in response to various signals transmitted by an external memory controller. For example, in accordance with various commands and addresses transmitted from outside of the resistive memory module 2000, the control chip 2100 may control write and read operations by activating the memory devices 2210 to 2240 in response to the transmitted commands and addresses. Also, the control chip 2100 may perform the following processes for read data output from each of the memory devices 2210 to 2240, for example, an error detection operation and a correction operation for the read data. Also, the control chip 2100 may control the memory devices 2210 to 2240 to control the number of cut-off voltages, which are generated by each of the memory devices 2210 to 2240, or differences between cut-off voltages.

Figure 24:
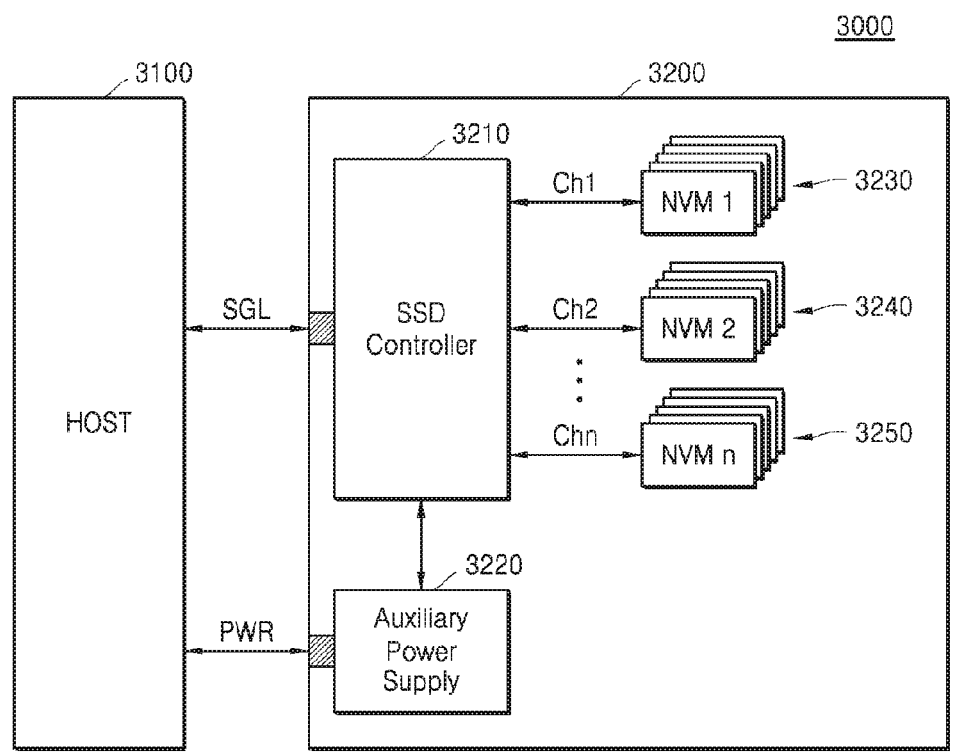
FIG. 24 is a block diagram illustrating an example in which a memory system according to one or more exemplary embodiments is applied to a solid state drive (SSD) system.

FIG. 24 is a block diagram of an example in which a memory system according to one or more exemplary embodiments is applied to a solid state drive (SSD) system 3000.

Referring to FIG. 24, the SSD system 3000 may include a host 3100 and an SSD 3200. The SSD 3200 exchanges signals with the host 3100 via a signal connector and receives power via a power connector. The SSD 3200 may include an SSD controller 3210, an auxiliary power supply 3220, and memory devices 3230 to 3250. In this case, the SSD 3200 may be implemented using the exemplary embodiments described with reference to FIGS. 1 to 22.

Figure 25:
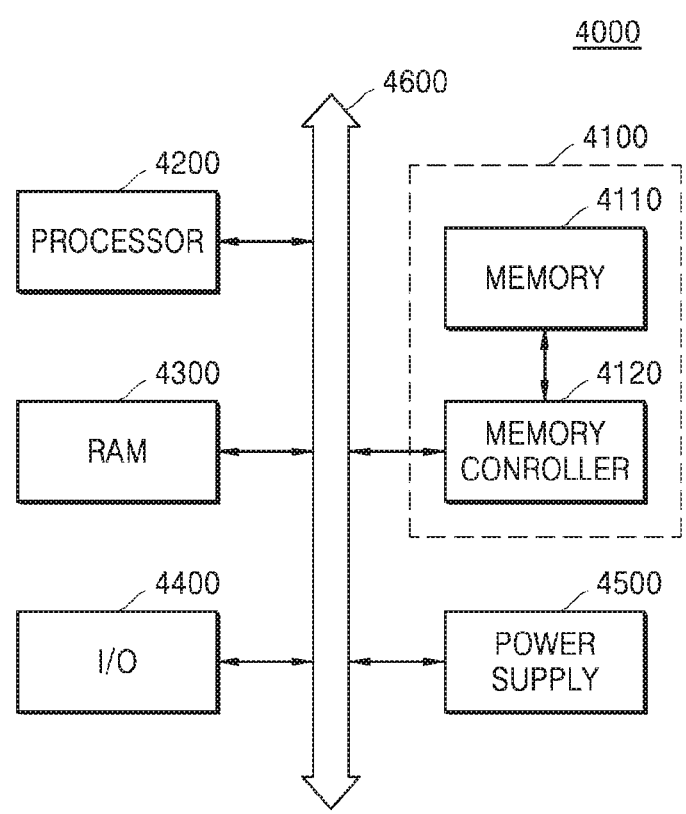
FIG. 25 is a block diagram illustrating a computing system including a memory system according to one or more exemplary embodiments.

FIG. 25 is a block diagram of a computing system 4000 including a memory system 4100 according to one or more exemplary embodiments.

Referring to FIG. 25, the computing system 4000 may include the memory system 4100, a processor 4200, RAM 4300, an input/output (I/O) device 4400, and a power supply 4500. Although not illustrated in FIG. 25, the computing system 4000 may further include ports configured to communicate with a video card, a sound card, a memory card, a USB device, or other electronic devices. The computing system 4000 may be implemented as a personal computer or a portable electronic device such as a laptop computer, a mobile phone, a personal digital assistant (PDA), or a camera.

The processor 4200 may perform certain calculations or tasks. According to exemplary embodiments, the processor 4200 may be a microprocessor, or a central processing unit (CPU). The processor 4200 may communicate with the RAM 4300, the I/O device 4400, and the memory system 4100 via a bus 4600 such as an address bus, a control bus, or a data bus. In this case, the memory system 4100 may be implemented using the exemplary embodiments described with reference to FIGS. 1 to 21.

According to exemplary embodiments, the processor 4200 may be connected to an expansion bus, e.g. a PCI bus.

The RAM 4300 may store data necessary to operate the computing system 4000. For example, the RAM 4300 may be implemented as, for example, dynamic random access memory (DRAM), mobile DRAM, high-speed static RAM (SRAM), PRAM, ferroelectric RAM (FeRAM), RRAM, and/or magnetic RAM (MRAM).

The I/O device 4400 may include an input device such as a keyboard, a keypad, or a mouse and an output device such as a printer or a display. The power supply 4500 may provide an operation voltage necessary for operations of the computing system 4000.

While the inventive concept has been particularly shown and described with reference to exemplary embodiments thereof, it will be understood that various changes in form and details may be made therein without departing from the spirit and scope of the following claims.

What is claimed is:

1. A method of operating a resistive memory system comprising a resistive memory device including multi-level memory cells that define a data cell array and a reference cell array, the method comprising:
setting levels of reference voltages used to determine resistance states of the multi-level memory cells such that a difference between the reference voltages used to determine a relatively high resistance state is greater than a difference between the reference voltages used to determine a relatively low resistance state, by programming reference cells in the reference cell array to have different resistance levels such that a difference between resistance levels of the reference cells in a relatively high resistance state is greater than a difference between resistance levels of the reference cells in a relatively low resistance state, and generating the reference voltages according to the resistance levels of the reference cells, wherein a difference between a first reference voltage and a second reference voltage among the reference voltages is greater than a difference between a third reference voltage and a fourth reference voltage, and wherein the first reference voltage corresponds to a resistance state that is relatively higher than a resistance state corresponding to the third reference voltage; and
reading data of the multi-level memory cells based on the reference voltages, by first reading the data of the multi-level memory cells based on the first reference voltage and the third reference voltage, and second reading the data of the multi-level memory cells based on the second reference voltage and the fourth reference voltage.

2. The method of claim 1, wherein a difference between the first reference voltage and the second reference voltage among the reference voltages is greater than a difference between the second reference voltage and the third reference voltage; and the second reference voltage and the third reference voltage correspond to a resistance state that is relatively lower than a resistance state corresponding to the first reference voltage.

3. The method of claim 2, wherein a level of the first reference voltage is higher than levels of the second reference voltage and the third reference voltage.

4. The method of claim 1, wherein the first to fourth reference voltages sequentially correspond to relatively low resistance states.

5. The method of claim 1, wherein the second reference voltage is a voltage having a first offset difference with the first reference voltage; and the fourth reference voltage is a voltage having a second offset difference with the third reference voltage.

6. The method of claim 1, further comprising:
decoding error-correcting code (ECC) data that is read during the first reading.

7. The method of claim 1, further comprising:
counting a number of memory cells corresponding to resistance level sections based on the data that is read during the first reading and the second reading; and
determining read levels of the reference voltages used to determine the resistance states, based on the counted number of memory cells.

8. The method of claim 1, wherein the resistive memory system further comprises a memory controller configured to control the resistive memory device and set levels of the reference voltages so that a difference between at least two reference voltages is different from another difference between another at least two reference voltages.

9. A method of operating a resistive memory system comprising multi-level memory cells that define a data cell array and a reference cell array, the method comprising:
programming first to third reference cells in the reference cell array to have different resistance levels such that a difference between resistance levels of the reference cells in a relatively high resistance state is greater than a difference between resistance levels of the reference cells in a relatively low resistance state, and such that a difference between resistance levels of the first reference cell and the second reference cell is greater than a difference between resistance levels of the second reference cell and the third reference cell;
generating first to third reference voltages used to determine resistance states of the multi-level memory cells and having different levels based on the resistance levels of a plurality of reference cells including the first to third reference cells, wherein a difference between a first reference voltage and a second reference voltage among the reference voltages is greater than a difference between the second reference voltage and the third reference voltage, and wherein the first reference voltage corresponds to a resistance state that is relatively higher than a resistance state corresponding to the third reference voltage; and
first reading data of the multi-level memory cells based on the first and third reference voltages generated with levels based on the resistance levels of the plurality of reference cell, and second reading data of the multi-level memory cells based on the second reference voltages generated with levels based on the resistance levels of the plurality of reference cells.

10. The method of claim 9, wherein the first to third reference voltages are generated respectively based on the first to third reference cells.

11. The method of claim 9, wherein the first reference cell has a resistance level that is higher than resistance levels of the second and third reference cells; and the second reference cell has a resistance level that is higher than the resistance level of the third reference cell.

12. A method of operating a resistive memory system comprising a memory controller, including a reference voltage setting unit, and configured to control a resistive memory device including a read circuit and associated multi-level memory cells that define a data cell array and a reference cell array, the method comprising:
setting levels of reference voltages, with the reference voltage setting unit, in the read circuit of the memory device that are used to determine resistance states of the multi-level memory cells such that a difference between the reference voltages used to determine a relatively high resistance state is greater than a difference between the reference voltages used to determine a relatively low resistance state, by programming reference cells in the reference cell array to have different resistance levels such that a difference between resistance levels of the reference cells in a relatively high resistance state is greater than a difference between resistance levels of the reference cells in a relatively low resistance state, and generating the reference voltages according to the resistance levels of the reference cells, wherein a difference between a first reference voltage and a second reference voltage among the reference voltages is greater than a difference between a third reference voltage and a fourth reference voltage, and wherein the first reference voltage corresponds to a resistance state that is relatively higher than a resistance state corresponding to the third reference voltage; and reading data of the multi-level memory cells, with the read circuit, based on the reference voltages, by first reading the data of the multi-level memory cells based on the first reference voltage and the third reference voltage, and second reading the data of the multi-level memory cells based on the second reference voltage and the fourth reference voltage.

13. The method of claim 12, wherein a difference between the first reference voltage and the second reference voltage among the reference voltages is greater than a difference between the second reference voltage and the third reference voltage; and the second reference voltage and the third reference voltage correspond to a resistance state that is relatively lower than a resistance state corresponding to the first reference voltage.

14. The method of claim 12, wherein a difference between the first reference voltage and the second reference voltage among the reference voltages is greater than a difference between the third reference voltage and the fourth reference voltage; and the first reference voltage corresponds to a resistance state that is relatively higher than a resistance state corresponding to the third reference voltage.

* * * * *